United States Patent
Inoue et al.

(10) Patent No.: US 7,344,986 B2
(45) Date of Patent: Mar. 18, 2008

(54) PLATING SOLUTION, SEMICONDUCTOR DEVICE AND METHOD FOR MANUFACTURING THE SAME

(75) Inventors: Hiroaki Inoue, Tokyo (JP); Xinming Wang, Kanagawa (JP); Moriji Matsumoto, Kanagawa (JP); Makoto Kanayama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 165 days.

(21) Appl. No.: 10/482,104

(22) PCT Filed: Nov. 6, 2002

(86) PCT No.: PCT/JP02/11572

§ 371 (c)(1),
(2), (4) Date: Jun. 4, 2004

(87) PCT Pub. No.: WO03/041145

PCT Pub. Date: May 15, 2003

(65) Prior Publication Data

US 2004/0235298 A1 Nov. 25, 2004

(30) Foreign Application Priority Data

Nov. 6, 2001 (JP) .............................. 2001-341051

(51) Int. Cl.
*H01L 21/4763* (2006.01)
(52) U.S. Cl. .............................. 438/688; 257/E21.586
(58) Field of Classification Search ................ 438/688; 257/E21.584
See application file for complete search history.

(56) References Cited

U.S. PATENT DOCUMENTS

| 5,705,230 A | * | 1/1998 | Matanabe et al. .......... 427/438 |
| 6,123,825 A | | 9/2000 | Uzoh et al. |
| 6,221,765 B1 | | 4/2001 | Ueno |

(Continued)

FOREIGN PATENT DOCUMENTS

JP 11-283981 10/1999

(Continued)

OTHER PUBLICATIONS

H. J. Blythe et al., "The influence of anneal on the strucural and magnetic properties of the electrodeposited thin-film alloy Cu .sub.94 Co .sub.6" Journal of Materials Science, vol. 31, 1996, pp. 6431-6439.*

(Continued)

*Primary Examiner*—W. David Coleman
(74) *Attorney, Agent, or Firm*—Wenderoth, Lind & Ponack, L.L.P.

(57) ABSTRACT

The present invention relates to a plating solution useful for forming embedded interconnects by embedding a conductive material in fine recesses for interconnects provided in the surface of a substrate, such as a semiconductor substrate, or for forming a protective layer for protecting the surface of embedded interconnects, a semiconductor device manufactured by using the plating solution and a method for manufacturing the semiconductor device. The plating solution contains copper ions, metal ions of a metal, and the metal is capable of forming with copper a copper alloy in which the metal does not form a solid solution with copper, a complexing agent, and a reducing agent free from alkali metal.

5 Claims, 20 Drawing Sheets

U.S. PATENT DOCUMENTS

| | | | |
|---|---|---|---|
| 6,291,082 B1* | 9/2001 | Lopatin | 428/621 |
| 6,495,443 B1* | 12/2002 | Lopatin et al. | 438/618 |
| 6,506,668 B1* | 1/2003 | Woo et al. | 438/584 |
| 6,605,874 B2* | 8/2003 | Leu et al. | 257/758 |
| 7,060,618 B2* | 6/2006 | Inoue et al. | 438/687 |
| 2002/0084529 A1* | 7/2002 | Dubin et al. | 257/774 |
| 2003/0057527 A1* | 3/2003 | Chung et al. | 257/642 |
| 2003/0075808 A1* | 4/2003 | Inoue et al. | 257/774 |
| 2003/0186540 A1* | 10/2003 | Ito et al. | 438/638 |
| 2004/0192021 A1* | 9/2004 | Li | 438/622 |
| 2004/0219298 A1* | 11/2004 | Fukunaga et al. | 427/304 |

FOREIGN PATENT DOCUMENTS

| | | |
|---|---|---|
| JP | 11-312655 | 11/1999 |
| JP | 2000-77360 | 3/2000 |
| JP | 2000-174025 | 6/2000 |
| JP | 2000-183160 | 6/2000 |
| JP | 2001-35812 | 2/2001 |
| JP | 0 194 515 | 4/2001 |
| JP | 2001-189287 | 7/2001 |
| JP | 2001-274116 | 10/2001 |

OTHER PUBLICATIONS

V. Ozolins et al., "Cu—Au, Ag—Au, Cu—Ag, and Ni—Au intermetallics: First-principles study of temperature-composition phase diagrams and structures", Mar. 15, 1998, vol. 57, No. 11, pp. 6427-6443.*

* cited by examiner

PLATING SOLUTION, SEMICONDUCTOR DEVICE AND METHOD FOR MANUFACTURING THE SAME

TECHNICAL FIELD

This invention relates to a plating solution, a semiconductor device and a method for manufacturing the semiconductor device. More particularly, the invention relates to a plating solution useful for forming embedded interconnects by embedding a conductive material in fine recesses for interconnects provided in the surface of a substrate, such as a semiconductor substrate, or for forming a protective layer for protecting the surface of embedded interconnects, a semiconductor device manufactured by using the plating solution, and a method for manufacturing the semiconductor device.

BACKGROUND ART

As a process for forming interconnects in a semiconductor device, the so-called "damascene process", which comprises filling trenches for interconnects and contact holes with a metal (conductive material), is coming into practical use. According to this process, a metal is embedded into trenches for interconnects and contact holes previously formed in the interlevel dielectric of a semiconductor substrate. Thereafter, an extra metal is removed by chemical mechanical polishing (CMP) so as to flatten the surface of the substrate.

In recent years, instead of aluminum or aluminum alloys generally used as a material for forming interconnection circuits on a semiconductor substrate, there is an eminent movement towards using copper. This is because the electric resistivity of copper, which is 1.72 μO cm, is about 40% lower than the electric resistivity of aluminum, and therefore copper interconnects suffer less from the signal delay phenomenon. Further, copper has a much higher electromigration resistance than aluminum, and is easier for use in dual-damascene processes. Thus, the use of copper offers a higher possibility of providing a complicated, fine multi-layer interconnection structure at a relatively low production cost.

In the case of interconnects formed by such a process, the embedded interconnects have an exposed surface after the flattening processing. When an additional embedded interconnect structure is formed on such an interconnects-exposing surface of a semiconductor substrate, the following problems may be encountered. For example, during the formation of a new $SiO_2$ at the next interlevel dielectric forming process, the exposed surface of the pre-formed interconnects is likely to be oxidized. Further, upon etching of the $SiO_2$ layer for formation of via holes, the pre-formed interconnects exposed on the bottoms of the via holes can be contaminated with an etchant, a peeled resist, etc.

In order to avoid such problems, it has conventionally been conducted to form a protective layer of SiN or the like not only on a circuit-formed region of a semiconductor substrate where the surfaces of the interconnections are exposed, but on the entire surface of the substrate, thereby preventing the contamination of the exposed interconnects with an etchant, etc.

However, the provision of a protective layer of SiN or the like on the entire surface of a semiconductor substrate, in a semiconductor device having an embedded interconnect structure, increases the dielectric constant of the interlevel dielectric, thus inducing interconnect delaying even when a low-resistivity material such as copper is employed for interconnects, whereby the performance of the semiconductor device may be impaired.

In view of this, it has been proposed to selectively cover the surface of the exposed interconnects to protect the interconnects with a protective layer of Co (Cobalt) or Co alloy having a good adhesion to an interconnect material such as copper and having a low resistivity (ρ). The protective layer is obtained, for example, by electroless plating.

Copper interconnects, formed by solely using copper as an interconnect material, have enhanced electromigration resistance and stress migration resistance as compared to aluminum interconnects, as described above. With the trend toward high-speed, highly-integrated semiconductor devices, however, there is a demand for interconnects having further enhanced electromigration resistance and stress migration resistance but not having an increased electric resistivity. With regard to the protective layer of Co or a Co alloy, which is obtained by electroless plating, for selective covering and protection of interconnects, Co or a Co alloy has a higher resistivity (ρ) than copper. A demand therefore exists for decreasing the resistivity (ρ) of the protective layer.

SUMMARY OF THE INVENTION

The present invention has been made in view of the above situation in the related art. It is therefore an object of the present invention to provide a plating solution useful for forming interconnects having enhanced electromigration resistance and stress migration resistance but not having an increased electric resistivity, or for forming a protective layer having a low resistivity to selectively cover and protect the surface of interconnects, a semiconductor device manufactured by using the plating solution, and a method for manufacturing the semiconductor device.

In order to achieve the above object, the present invention provides a plating solution comprising copper ions, metal ions of a metal, in which the metal is capable of forming with copper a copper alloy in which the metal does not form a solid solution with copper, a complexing agent, and a reducing agent free from alkali metal.

Plating with the use of the plating solution can produce a plated film, composed of a copper alloy of copper and a metal in which the metal does not form a solid solution with copper, having almost the same electric resistivity as copper and having enhanced electromigration resistance and stress migration resistance as compared to copper. The "copper alloy of copper and a metal in which the metal does not form a solid solution with copper" herein refers to a copper alloy, such as a copper-silver alloy, in which the alloy components (e.g. copper and silver) do not form a single or mutual crystal lattice (i.e. the alloy components, e.g. copper and silver, do not form a mixed crystal), but the respective crystals of the alloy components (e.g. copper crystal and silver crystal) are co-present.

The metal ions may be silver ions, cobalt ions or tin ions.

The reducing agent may be an alkylamine borane. The use as a reducing agent of an alkylamine borane, which does not contain sodium, can prevent alkali metal contamination of semiconductor devices. Specific examples of the alkylamine borane may include dimethylamine borane, diethylamine borane, and trimethylamine borane.

The plating solution may further include at least one of a stabilizer selected from one or more kinds of sulfur compounds, nitrogen compounds and heavy metal compounds, and a surfactant.

It is preferred that a pH of the plating solution is adjusted in a range of 5 to 14 using a pH adjusting agent free from alkali metal. By thus adjusting the pH of the plating solution with an alkali metal-free pH adjusting agent, inclusion of an alkali metal, such as sodium, in the plating solution can be prevented. Examples of such pH adjusting agents include ammonia water and tetramethylammonium hydroxide (TMAH). The pH of the plating solution is preferably adjusted to 7-13.

The present invention provides a semiconductor device having interconnects of a copper alloy, formed by embedding the copper alloy in fine recesses for interconnects provided in the surface of a substrate, said copper alloy being an alloy of copper and a metal in which the metal does not form a solid solution with copper.

Owing to the use of the specific copper alloy as an interconnect material, the semiconductor device can have interconnects with enhanced electromigration resistance and stress migration resistance but without an increase in electric resistivity as compared to the sole use of copper as an interconnect material.

The copper alloy may be a copper-silver alloy, a copper-cobalt alloy or a copper-tin alloy.

It is preferred that the copper content of the copper alloy is in a range of 90 to 99.99 at %.

The present invention further provides a semiconductor device having an embedded interconnect structure and having a protective layer of a copper alloy selectively formed on at least part of exposed interconnects, the copper alloy being an alloy of copper and a metal in which the metal does not form a solid solution with copper.

The semiconductor device is thus provided with a protective layer composed of the specific copper alloy, i.e. the copper alloy of copper and a metal in which the metal does not form a solid solution with copper, having a strong adhesion to silver or copper and having a low resistivity ($\rho$). The interconnects of the semiconductor device can be selectively covered and protected with the protective layer without an increase of interconnect resistivity.

The protective layer may have a thickness in a range of 0.1 to 500 nm.

The present invention provides a method for manufacturing a semiconductor device, comprising: plating the surface of a semiconductor substrate, having in the surface fine recesses for interconnects, thereby embedding a copper alloy in the fine recesses to form interconnects. The copper alloy is an alloy of copper and a metal in which the metal does not form a solid solution with copper.

The present invention further provides a method for manufacturing a semiconductor device, comprising: plating the surface of a semiconductor substrate, having an embedded interconnect structure, thereby forming a protective layer of a copper alloy selectively on at least part of exposed interconnects. The copper alloy is an alloy of copper and a metal in which the metal does not form a solid solution with copper.

The above and other objects, features, and advantages of the present invention will be apparent from the following description when taken in conjunction with the accompanying drawings which illustrates preferred embodiments of the present invention by way of example.

DETAILED DESCRIPTION OF THE INVENTION

Preferred embodiments of the present invention will now be described with reference to the drawings.

Figure 1A:
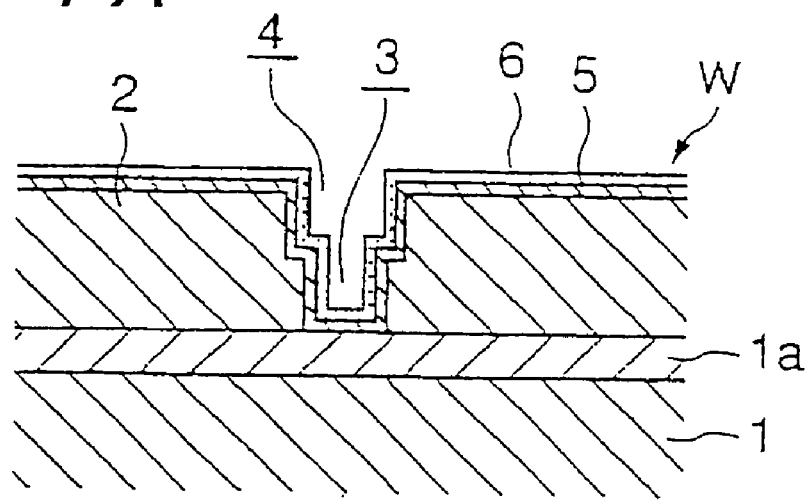
FIGS. 1A through 1C are diagrams illustrating, in sequence of process steps, an example of the formation of copper alloy interconnects in a semiconductor device according to the present invention.
Figure 1B:
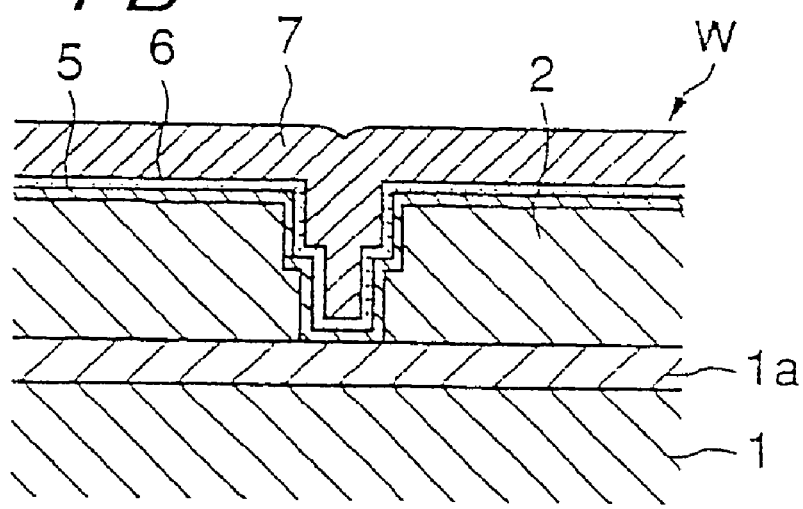
Figure 1C:
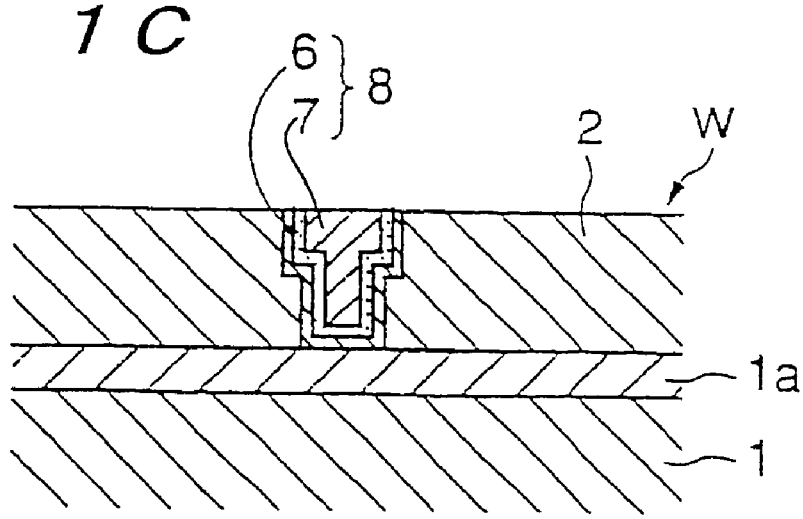

FIGS. 1A through 1C illustrate, in a sequence of process steps, an example of forming copper alloy interconnects in a semiconductor device according to the present invention. As shown in FIG. 1A, an insulating film 2 of e.g. $SiO_2$ is deposited on a conductive layer 1a in which semiconductor devices are provided, which is formed on a semiconductor base 1. Contact holes 3 and trenches 4 for interconnects are formed in the insulating film 2 by the lithography/etching technique. Thereafter, a barrier layer 5 of TaN or the like is formed on the entire surface, and a seed layer 6 as an electric supply layer for electroplating is formed on the barrier layer 5 by sputtering or the like.

Then, as shown in FIG. 1B, electroless copper alloy plating is performed onto the surface of the semiconductor substrate W to fill the contact holes 3 and the trenches 4 with copper alloy and, at the same time, deposit a copper alloy film 7 on the insulating film 2. Thereafter, the copper alloy film 7 and the barrier layer 5 on the insulating layer 2 are removed by chemical mechanical polishing (CMP) so as to make the surface of the copper-alloy film 7 filled in the contact holes 3 and the trenches 4 for interconnects and the surface of the insulating film 2 lie substantially on the same plane. Interconnects 8 composed of the seed layer 6 and the copper alloy film 7, as shown in FIG. 1C, are thus formed in the insulating layer 2.

The copper alloy film 7 is composed of a copper alloy of copper and a metal in which the metal does not form a solid solution with copper, a copper-silver alloy according to this example. The copper content of the copper alloy is e.g. 98 at %. The interconnects 8 composed of such a copper alloy film 7, as compared to interconnects composed solely of copper, have enhanced electromigration resistance and stress migration resistance, while the electric resistivity is not increased. In this regard, in the case of a copper-silver alloy, copper and silver do not form a single or mutual crystal lattice, i.e. do not form a mixed crystal, but the crystal of copper and the crystal of silver are co-present. The co-presence of the copper and silver crystals can enhance the electromigration resistance and stress migration resistance as compared to the sole presence of copper crystal, while an increase of the electric resistivity can be prevented by the presence of copper crystal in a major proportion.

Though in this example a copper-silver alloy is used as the copper alloy of copper and a metal in which the metal does not form a solid solution with copper, it is possible to use a copper-cobalt alloy or a copper-tin alloy instead of a copper-silver alloy. The copper content each of these copper alloys is preferably 90 to 99.99 at %.

The copper alloy film 7, composed of a copper-silver alloy, can be formed by using an electroless copper alloy plating solution, comprising copper ions, silver ions, a complexing agent and an alkali metal-free reducing agent, and immersing the surface of the substrate W in the plating solution.

A copper salt, such as copper sulfate or copper chloride, may be used as a supply source of the copper ions in the plating solution. The amount of copper ions in the plating solution is generally 0.001 to 1 mol/L, preferably 0.001 to 0.1 mol/L. A silver salt, such as silver nitrate or silver sulfate, may be used as a supply source of the silver ions. The amount of silver ions in the plating solution is generally 0.001 to 0.1 mol/L, preferably 0.001 to 0.1 mol/L.

Specific examples of the complexing agent may include organic acids, such as acetic acid and tartaric acid, and their salts; aminocarboxylic acids, such as EDTA, and their salts; amines, such as ethylendiamine and quardrol-bath, and their salts; polyhydric alcohols such as glycerol and mannitol; and sulfur compounds, such as thiosulfuric acid and thiourea. These compounds may be used either singly or as a mixture of two or more. The total amount of the complexing agent is generally 0.001-2.0 mol/L, preferably 0.01-1.0 mol/L.

Regarding the pH adjusting agent, any agent may be used that does not contain sodium or any other alkali metal. Ammonia water and tetramethylammonium hydroxide (TMAH) may be mentioned as specific examples. By using the pH adjusting agent, the pH of the plating solution is adjusted generally within the range of 5-14, preferably 7-13.

The reducing agent likewise should not contain sodium or any other alkali metal. An alkylamine borane is preferably used. As alkylamine boranes, dimethylamine borane (DMAB) and diethylamine borane, may be mentioned. The reducing agent is used generally in an amount of 0.001-1.0 mol/L, preferably 0.01-0.5 mol/L.

Besides the above described compounds, other known additives may be added to the plating solution. Examples of usable additive include a bath stabilizer, which may be a heavy metal compound such as a lead compound, a sulfur compound such as a thiocyanate, or a mixture thereof, and a surfactant of an anionic, cationic or nonionic type. Either one or both of the bath stabilizer and the surfactant may be used. The temperature of the plating solution is generally in the range of 20-90° C., preferably 20-70° C.

As described above, though in this example a copper-silver alloy is used as the copper alloy for forming the copper alloy film 7, it is possible to use a copper-cobalt alloy or a copper-tin alloy instead of a copper-silver alloy. The cobalt ions contained in the plating solution for forming a copper-cobalt alloy film may be supplied from a cobalt salt, for example, cobalt sulfate, cobalt chloride or cobalt acetate. The amount of the cobalt ions is generally in the range of 0.001-1.0 mol/L, preferably 0.005-0.5 mol/L.

Figure 2:
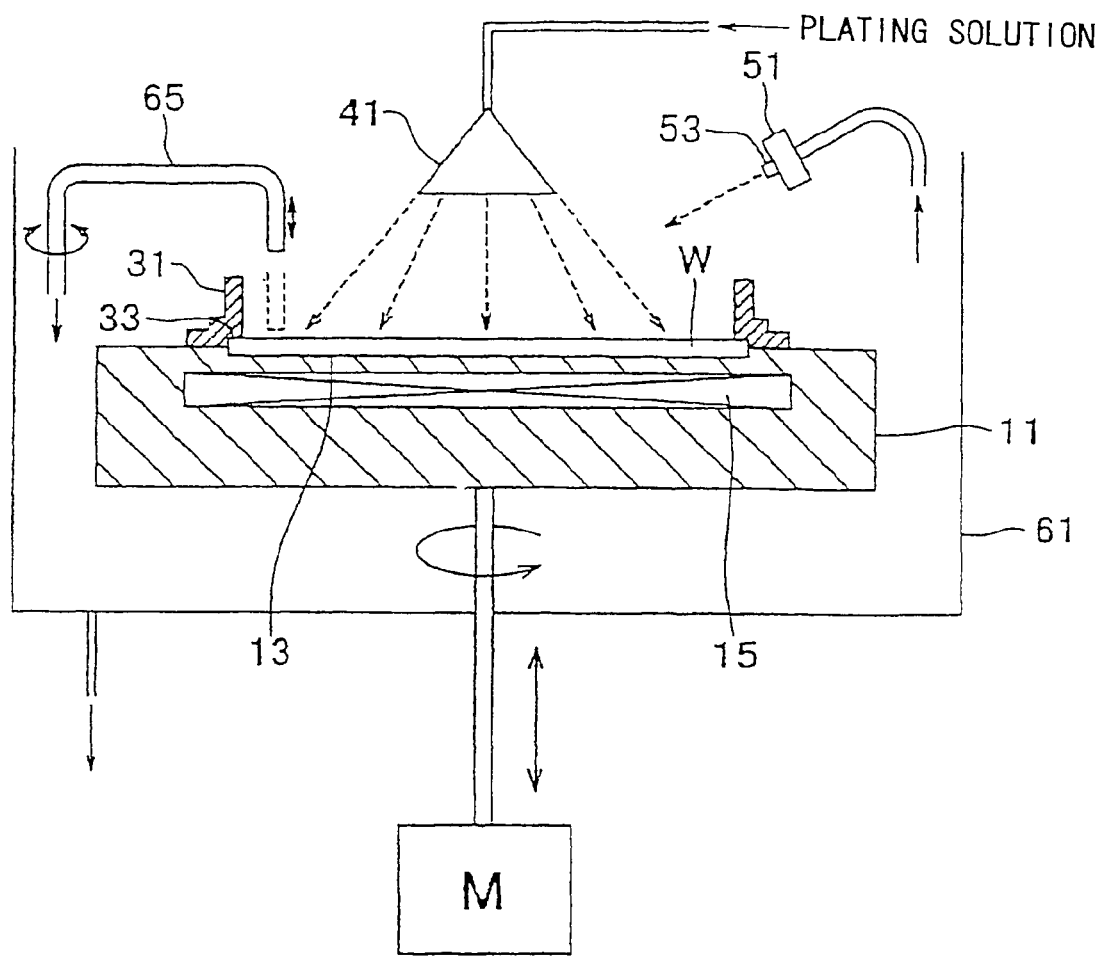
FIG. 2 is a schematic view showing an example of an electroless plating apparatus.

FIG. 2 is a schematic constitution drawing of the electroless plating apparatus. As shown in FIG. 2, this electroless plating apparatus comprises holding means 11 for holding a semiconductor substrate W on its upper surface, a dam member (plating solution holding mechanism) 31 for contacting a peripheral edge portion of a surface to be plated (upper surface) of the semiconductor substrate W held by the holding means 11 to seal the peripheral edge portion, and a shower head (an electroless plating solution (scattering) supply means) 41 for supplying a plating solution (an electroless plating solution) to the plating surface of the semiconductor substrate W having the peripheral edge portion sealed with the dam member 31. The electroless plating apparatus further comprises cleaning liquid supply means 51 disposed near an upper outer periphery of the holding means 11 for supplying a cleaning liquid to the plating surface of the semiconductor substrate W, a recovery vessel 61 for recovering a cleaning liquid or the like (plating waste liquid) discharged, a plating solution recovery nozzle 65 for sucking in and recovering the plating solution held on the semiconductor substrate W, and a motor (rotational drive means) M for rotationally driving the holding means 11.

The holding means 11 has a substrate placing portion 13 on its upper surface for placing and holding the semiconductor substrate W. The substrate placing portion 13 is adapted to place and fix the semiconductor substrate W. Specifically, the substrate placing portion 13 has a vacuum attracting mechanism (not shown) for attracting the semiconductor substrate W on a backside thereof by vacuum suction. A backside heater (heating means) 15, which is planar and heats the plating surface of the semiconductor substrate W from underside to keep it warm, is installed on the backside of the substrate placing portion 13. The backside heater 15 is composed of, for example, a rubber heater. This holding means 11 is adapted to be rotated by the motor M and is movable vertically by lifting means (not shown).

The dam member 31 is cylindrical, has a seal portion 33 provided in a lower portion thereof for sealing the outer peripheral edge of the semiconductor substrate W, and is installed so as not to move vertically from the illustrated position.

The shower head 41 is of a structure having many nozzles provided at the front end for scattering the supplied plating solution in a shower form and supplying it substantially uniformly to the plating surface of the semiconductor substrate W. The cleaning liquid supply means 51 has a structure for ejecting a cleaning liquid from a nozzle 53.

The plating solution recovery nozzle 65 is adapted to be movable upward and downward and swingable, and the front end of the plating solution recovery nozzle 65 is adapted to be lowered inwardly of the dam member 31 located on the upper surface peripheral edge portion of the semiconductor substrate W and to suck in the plating solution on the semiconductor substrate W.

Next, the operation of the electroless plating apparatus will be described. First, the holding means 11 is lowered from the illustrated state to provide a gap of a predetermined dimension between the holding means 11 and the dam member 31, and the semiconductor substrate W is placed on and fixed to the substrate placing portion 13. An 8-inch wafer, for example, is used as the semiconductor substrate W.

Then, the holding means 11 is raised to bring its upper surface into contact with the lower surface of the dam member 31 as illustrated in FIG. 2, and the outer periphery of the semiconductor substrate W is sealed with the seal portion 33 of the dam member 31. At this time, the surface of the semiconductor substrate W is in an open state.

Then, the semiconductor substrate W itself is directly heated by the backside heater 15, while the plating solution is ejected from the shower head 41 to pour the plating solution over substantially the entire surface of the semiconductor substrate W. Since the surface of the semiconductor substrate W is surrounded by the dam member 31, the poured plating solution is all held on the surface of the semiconductor substrate W. The amount of the supplied plating solution may be a small amount which will become a 1 mm thickness (about 30 ml) on the surface of the semiconductor substrate W. The depth of the plating solution held on the surface to be plated may be 10 mm or less, and may be even 1 mm as in this embodiment. If a small amount of the supplied plating solution is sufficient, the heating apparatus for heating the plating solution may be of a small size.

If the semiconductor substrate W itself is adapted to be heated, the temperature of the plating solution requiring great power consumption for heating need not be raised so high. This is preferred, because power consumption can be decreased, and a change in the property of the plating solution can be prevented. Power consumption for heating of the semiconductor substrate W itself may be small, and the amount of the plating solution stored on the semiconductor substrate W is also small. Thus, heat retention of the semiconductor substrate W by the backside heater 15 can be performed easily, and the capacity of the backside heater 15 may be small, and the apparatus can be made compact. If means for directly cooling the semiconductor substrate W itself is used, switching between heating and cooling may be performed during plating to change the plating conditions. Since the plating solution held on the semiconductor substrate is in a small amount, temperature control can be performed with good sensitivity.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating solution. Then, the semiconductor substrate W is kept stationary, and electroless plating is performed for 1 minute. The instantaneous rotating time is 10 seconds or less at the longest.

After completion of the plating treatment, the front end of the plating solution recovery nozzle 65 is lowered to an area near the inside of the dam member 31 on the peripheral edge portion of the semiconductor substrate W to suck in the plating solution. At this time, if the semiconductor substrate W is rotated at a rotational speed of, for example, 100 rpm or less, the plating solution remaining on the semiconductor substrate W can be gathered in the portion of the dam member 31 on the peripheral edge portion of the semiconductor substrate W under centrifugal force, so that recovery of the plating solution can be performed with a good efficiency and a high recovery rate. The holding means 11 is lowered to separate the semiconductor substrate W from the dam member 31. The semiconductor substrate W is started to be rotated, and the cleaning liquid (ultrapure water) is jetted at the plated surface of the semiconductor substrate W from the nozzle 53 of the cleaning liquid supply means 51 to cool the plated surface, and simultaneously perform dilution and cleaning, thereby stopping the electroless plating reaction. At this time, the cleaning liquid jetted from the nozzle 53 may be supplied to the dam member 31 to perform cleaning of the dam member 31 at the same time. The plating waste solution at this time is recovered into the recovery vessel 61 and discarded.

The plating solution once used is not reused, but thrown away. As stated above, the amount of the plating solution used in this apparatus can be made very small, compared with that in the prior art. Thus, the amount of the plating solution which is discarded is small, even without reuse. In some cases, the plating solution recovery nozzle 65 may not be installed, and the plating solution which has been used may be recovered as a plating waste solution into the recovery vessel 61, together with the cleaning liquid.

Then, the semiconductor substrate W is rotated at a high speed by the motor M for spin-drying, and then the semiconductor substrate W is removed from the holding means 11.

Figure 3:
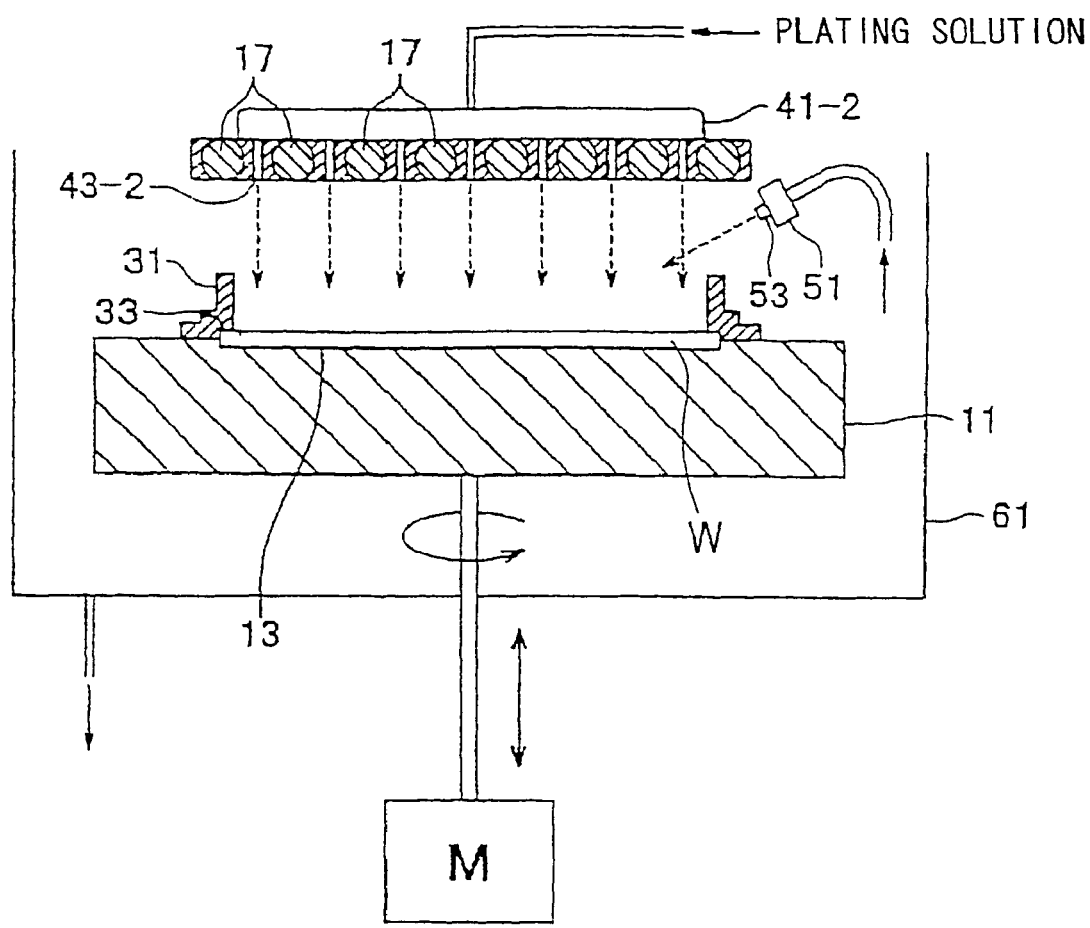
FIG. 3 is a schematic view showing another example of an electroless plating apparatus.

FIG. 3 is a schematic constitution drawing of another electroless plating apparatus. The example of FIG. 3 is different from the aforementioned elecroless plating apparatus shown in FIG. 2 in that instead of providing the backside heater 15 in the holding means 11, lamp heaters (heating means) 17 are disposed above the holding means 11, and the lamp heaters 17 and a shower head 41-2 are integrated: For example, a plurality of ring-shaped lamp heaters 17 having different radii are provided concentrically, and many nozzles 43-2 of the shower head 41-2 are open in a ring form from the gaps between the lamp heaters 17. The lamp heaters 17 may be composed of a single spiral lamp heater, or may be composed of other lamp heaters of various structures and arrangements.

Even with this constitution, the plating solution can be supplied from each nozzle 43-2 to the surface, to be plated, of the semiconductor substrate W substantially uniformly in a shower form. Further, heating and heat retention of the semiconductor substrate W can be performed by the lamp heaters 17 directly uniformly. The lamp heaters 17 heat not only the semiconductor substrate W and the plating solution, but also ambient air, thus exhibiting a heat retention effect on the semiconductor substrate W.

Direct heating of the semiconductor substrate W by the lamp heaters 17 requires the lamp heaters 17 with relatively large power consumption. In place of such lamp heaters 17, lamp heaters 17 with relatively small power consumption and the backside heater 15 shown in FIG. 2 may be used in combination to heat the semiconductor substrate W mainly with the backside heater 15 and to perform heat retention of the plating solution and ambient air mainly by the lamp heaters 17. In the same manner as in the aforementioned embodiment, means for directly or indirectly cooling the semiconductor substrate W may be provided to perform temperature control.

Figure 4A:
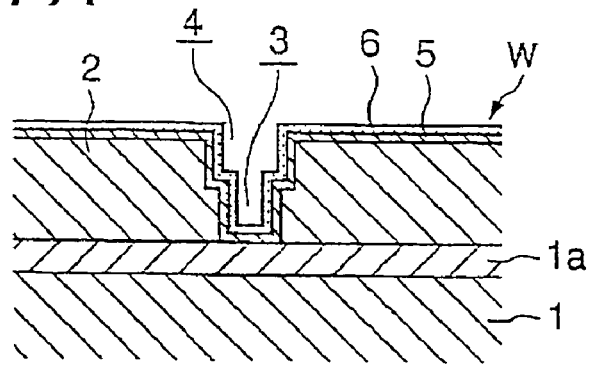
FIGS. 4A through 4D are diagrams illustrating, in sequence of process steps, an example of the formation of a protective layer, composed of a copper alloy, selectively on the exposed surface of embedded interconnects in a semiconductor device according to the present invention.

FIGS. 4A through 4D are diagrams illustrating, in sequence of process steps, an example of the formation of a protective layer, composed of a copper alloy, selectively on the exposed surface of embedded interconnects in a semiconductor device according to the present invention. As shown in FIG. 4A, an insulating film 2 of e.g. $SiO_2$ is deposited on a conductive layer 1a in which semiconductor devices are provided, which is formed on a semiconductor base 1. Contact holes 3 and trenches 4 for interconnects are formed in the insulating film 2 by the lithography/etching technique. Thereafter, a barrier layer 5 of TaN or the like is formed on the entire surface, and a seed layer 6 as an electric supply layer for electroplating is formed on the barrier layer 5, for example, by sputtering.

Figure 4B:
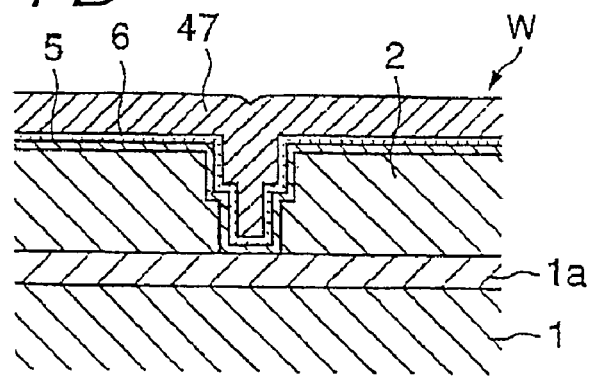
Figure 4C:
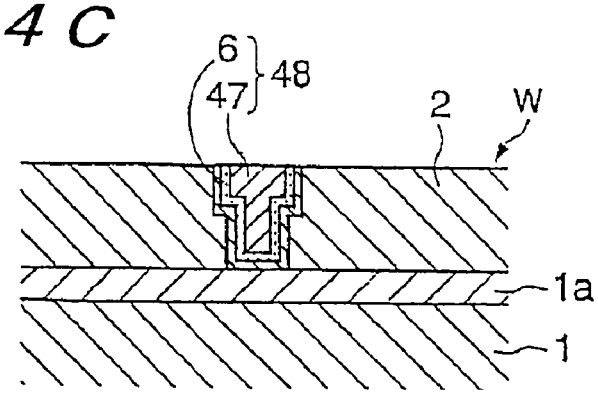

Thereafter, as shown in FIG. 4B, copper plating is carried out onto the surface of the semiconductor substrate W to fill the contact holes 3 and the trenches 4 with copper and, at the same time, deposit a copper film 47 on the insulating film 2. Thereafter, the copper film 47 and the barrier layer 5 on the insulating film 2 are removed by chemical mechanical polishing (CMP) so as to make the surface of the copper film 47 filled in the contact holes 3 and the trenches 4 for interconnects and the surface of the insulating film 2 lie substantially on the same plane. Interconnects 48 composed of the copper seed layer 6 and the copper film 47, as shown in FIG. 4C, are thus formed in the insulating layer 2.

Figure 4D:
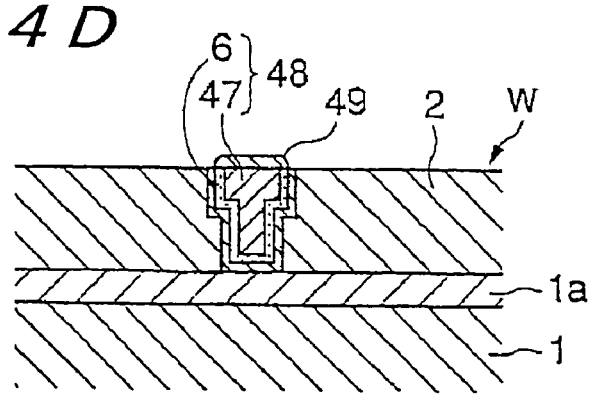

Next, electroless copper alloy plating is carried out onto the surface of the substrate W to form a protective layer (plated film) 49 composed of a copper alloy selectively on the exposed surface of interconnects 48 to protect the interconnects 48, as shown in FIG. 4D. The thickness of the protective layer 49 is generally 0.1 to 500 nm, preferably 1 to 200 nm, more preferably 10 to 100 nm. Though copper is used as an interconnect material in this example, a copper alloy, silver or a silver alloy may be used instead of copper.

The protective layer 49 is composed of a copper alloy of copper and a metal in which the metal does not form a solid solution with copper, a copper-silver alloy according to this example. The copper content of the copper alloy is e.g. 98 at %. The semiconductor device is thus provided with the protective layer 49 composed of the specific copper alloys having a strong adhesion to copper or silver and having a low resistivity (ρ) and formed selectively on the exposed surface of interconnects 48. The interconnects 48 of the semiconductor device can be selectively covered and protected with the protective layer 49 without an increase of interconnect resistivity.

According to this example, the same plating solution and the same electroless plating apparatus as in the above-described example are used for the formation of the copper alloy of copper and a metal in which the metal does not form a solid solution with copper, e.g. a copper-silver alloy, and hence a description thereof is omitted.

Though the above-described examples relate to application to electroless plating, the present invention is of course applicable to electroplating in which plating is effected by passing an electric current between an anode and a cathode, both immersed in a plating solution.

As described hereinabove, the present invention makes it possible to form interconnects having enhanced electromigration resistance and stress migration resistance but not having an increased electric resistivity, or form a protective layer having a low resistivity to selectively cover and protect the surface of interconnects.

Figure 5:
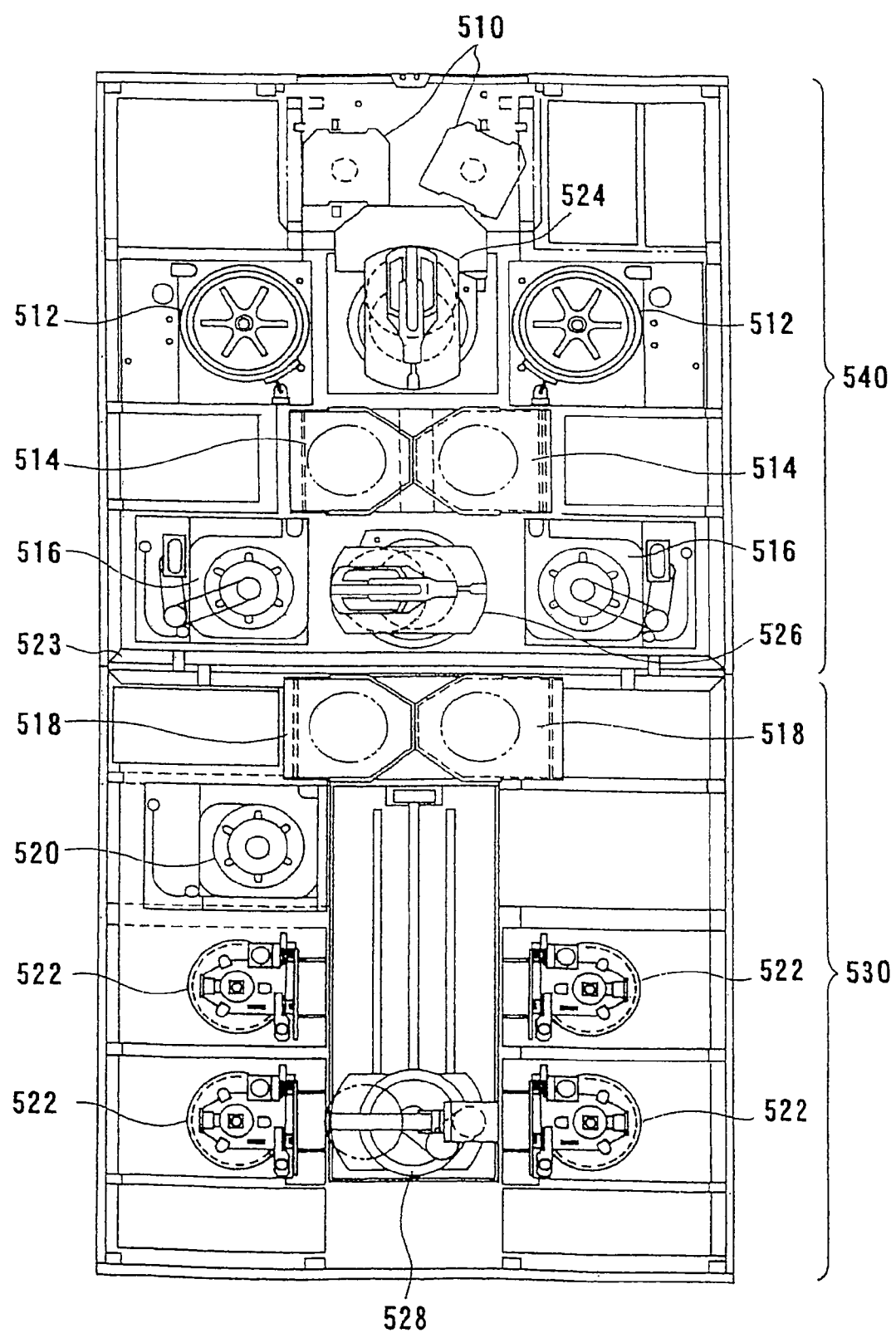
FIG. 5 is a plan view of an example of a substrate plating apparatus.

FIG. 5 is a plan view of an example of a substrate plating apparatus. The substrate plating apparatus comprises loading/unloading sections 510, each pair of cleaning/drying sections 512, first substrate stages 514, bevel-etching/chemical cleaning sections 516 and second substrate stages 518, a washing section 520 provided with a mechanism for reversing the substrate through 180°, and four plating apparatuses 522. The plating substrate apparatus is also provided with a first transferring device 524 for transferring a substrate between the loading/unloading sections 510, the cleaning/drying sections 512 and the first substrate stages 514, a second transferring device 526 for transferring a substrate between the first substrate stages 514, the bevel-etching/chemical cleaning sections 516 and the second substrate stages 518, and a third transferring device 528 for transferring the substrate between the second substrate stages 518, the washing section 520 and the plating apparatuses 522.

The substrate plating apparatus has a partition wall 523 for dividing the plating apparatus into a plating space 530 and a clean space 540. Air can individually be supplied into and exhausted from each of the plating space 530 and the clean space 540. The partition wall 523 has a shutter (not shown) capable of opening and closing. The pressure of the clean space 540 is lower than the atmospheric pressure and higher than the pressure of the plating space 530. This can prevent the air in the clean space 540 from flowing out of the plating apparatus and can prevent the air in the plating space 530 from flowing into the clean space 540.

Figure 6:
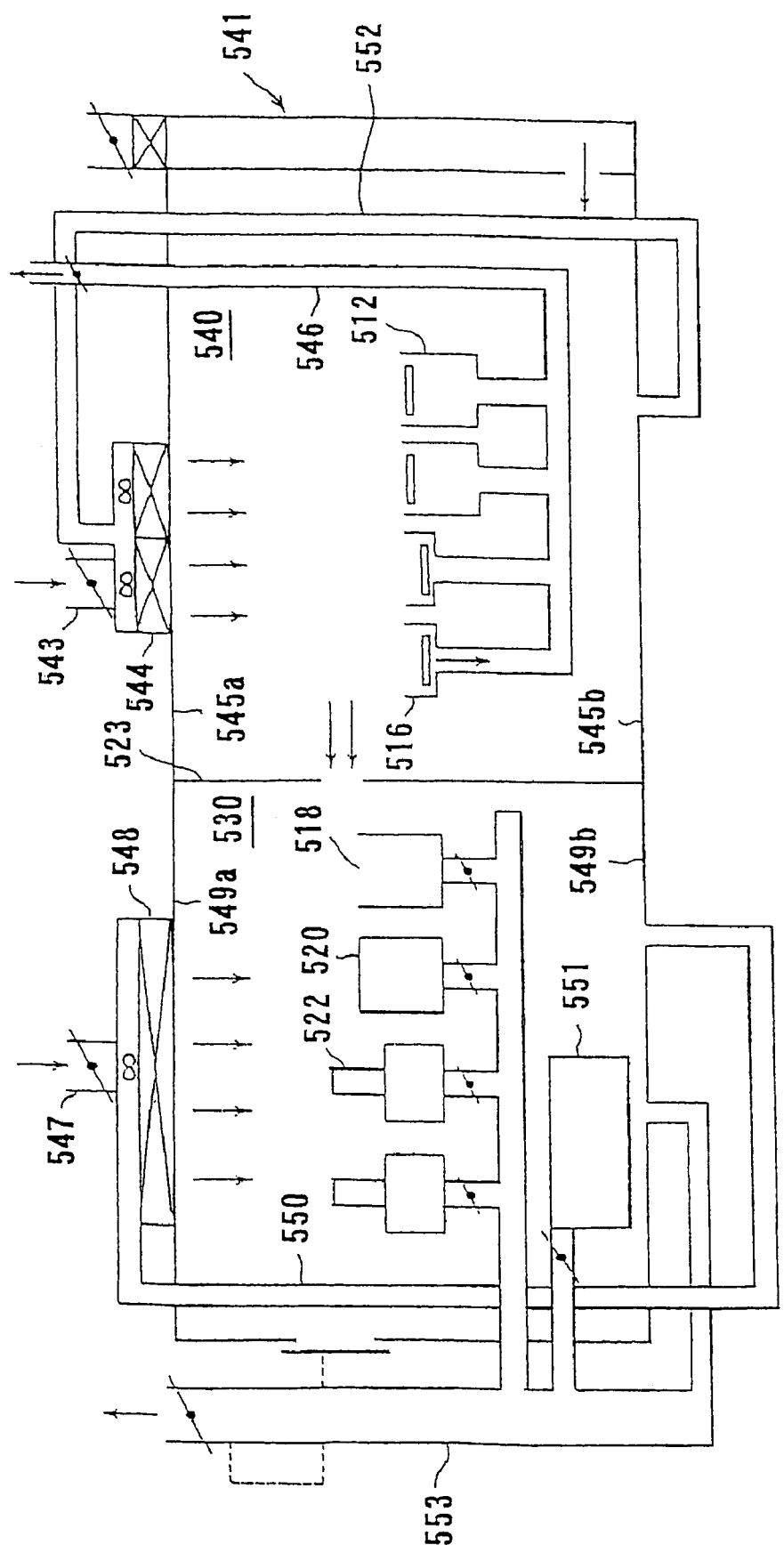
FIG. 6 is a schematic view showing airflow in the substrate plating apparatus shown in FIG. 5.

FIG. 6 is a schematic view showing an air current in the plating substrate apparatus. In the clean space 540, a fresh external air is introduced through a pipe 543 and pushed into the clean space 540 through a high-performance filter 544 by a fan. Hence, a down-flow clean air is supplied from a ceiling 545a to positions around the cleaning/drying sections 512 and the bevel-etching/chemical cleaning sections 516. A large part of the supplied clean air is returned from a floor 545b through a circulation pipe 552 to the ceiling 545a, and pushed again into the clean space 540 through the high-performance filter 544 by the fan, to thus circulate in the clean space 540. A part of the air is discharged from the cleaning/drying sections 512 and the bevel-etching/chemical cleaning sections 516 through a pipe 546 to the exterior, so that the pressure of the clean space 540 is set to be lower than the atmospheric pressure.

The plating space 530 having the washing sections 520 and the plating apparatuses 522 therein is not a clean space (but a contamination zone). However, it is not acceptable to attach particles to the surface of the substrate. Therefore, in the plating space 530, a fresh external air is introduced through a pipe 547, and a down-flow clean air is pushed into the plating space 530 through a high-performance filter 548 by a fan, for thereby preventing particles from being attached to the surface of the substrate. However, if the whole flow rate of the down-flow clean air is supplied by only an external air supply and exhaust, then enormous air supply and exhaust are required. Therefore, the air is discharged through a pipe 553 to the exterior, and a large part of the down-flow is supplied by a circulating air through a circulation pipe 550 extended from a floor 549b, in such a state that the pressure of the plating space 530 is maintained to be lower than the pressure of the clean space 540.

Thus, the air returned to a ceiling 549a through the circulation pipe 550 is pushed again into the plating space 530 through the high-performance filter 548 by the fan. Hence, a clean air is supplied into the plating space 530 to thus circulate in the plating space 530. In this case, air containing chemical mist or gas emitted from the washing sections 520, the plating sections 522, the third transferring device 528, and a plating solution regulating bath 551 is discharged through the pipe 553 to the exterior. Thus, the pressure of the plating space 530 is controlled so as to be lower than the pressure of the clean space 540.

Figure 7:
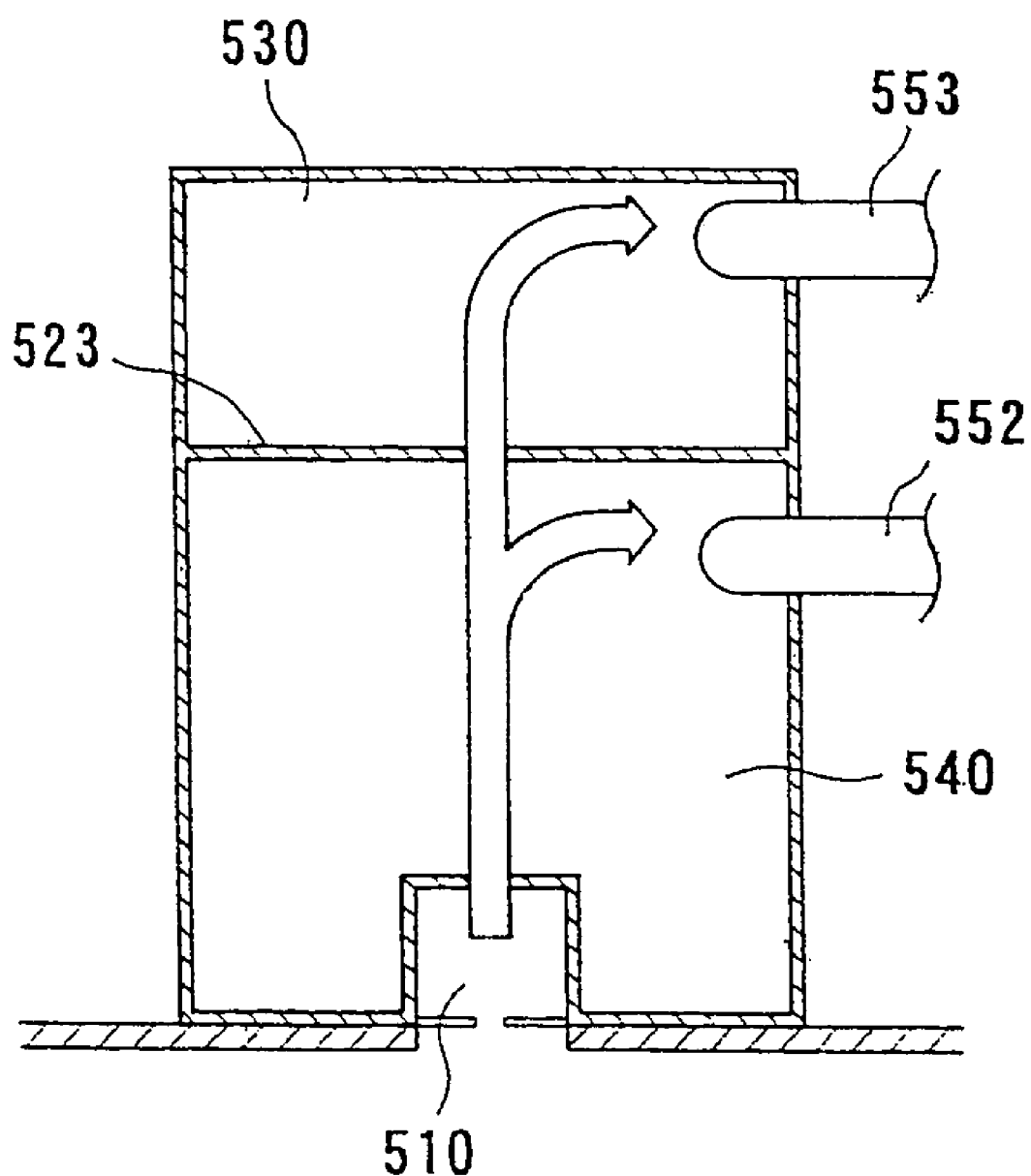
FIG. 7 is a cross-sectional view showing airflows among areas in the substrate plating apparatus shown in FIG. 5.

The pressure in the loading/unloading sections 510 is higher than the pressure in the clean space 540 which is higher than the pressure in the plating space 530. When the shutters (not shown) are opened, therefore, air flows successively through the loading/unloading sections 510, the clean space 540, and the plating space 530, as shown in FIG. 7. Air discharged from the clean space 540 and the plating space 530 flows through the ducts 552, 553 into a common duct 554 (see FIG. 8) which extends out of the clean room.

Figure 8:
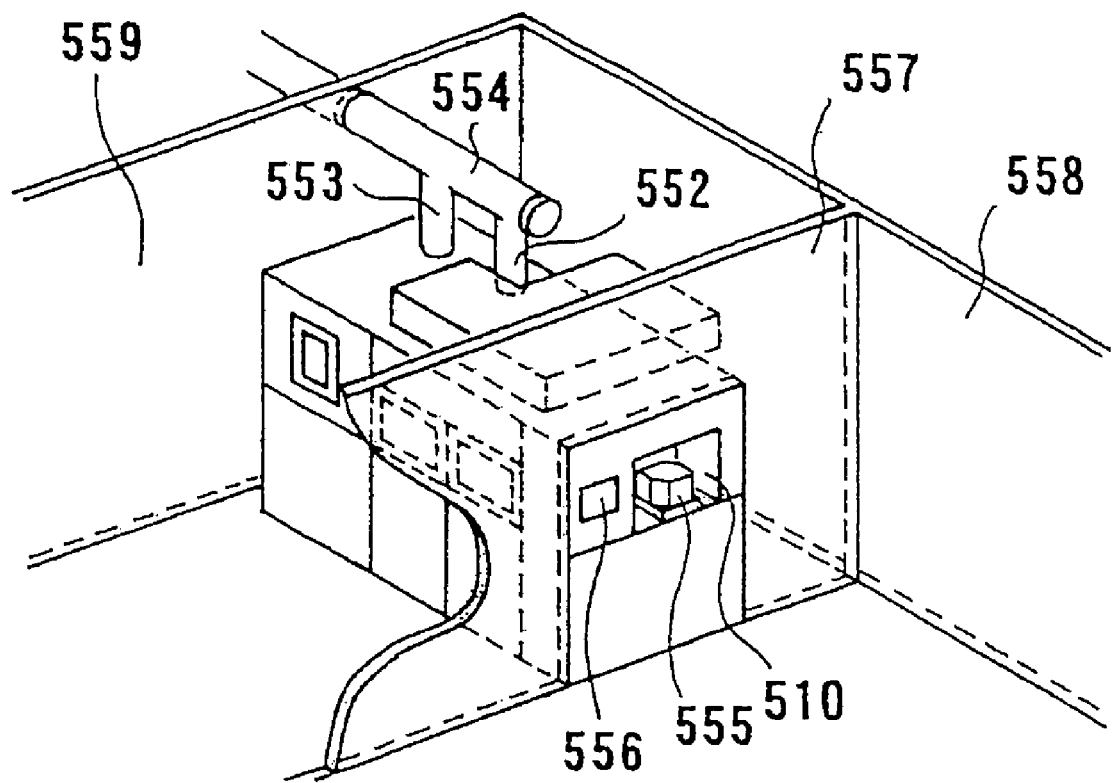
FIG. 8 is a perspective view of the substrate plating apparatus shown in FIG. 5, which is placed in a clean room.

FIG. 8 shows in perspective the substrate plating apparatus shown in FIG. 5, which is placed in the clean room. The loading/unloading sections 510 includes a side wall which has a cassette transfer port 555 defined therein and a control panel 556, and which is exposed to a working zone 558 that is compartmented in the clean room by a partition wall 557. The partition wall 557 also compartments a utility zone 559 in the clean room in which the substrate plating apparatus is installed. Other sidewalls of the substrate plating apparatus are exposed to the utility zone 559 whose air cleanness is lower than the air cleanness in the working zone 558.

Figure 9:
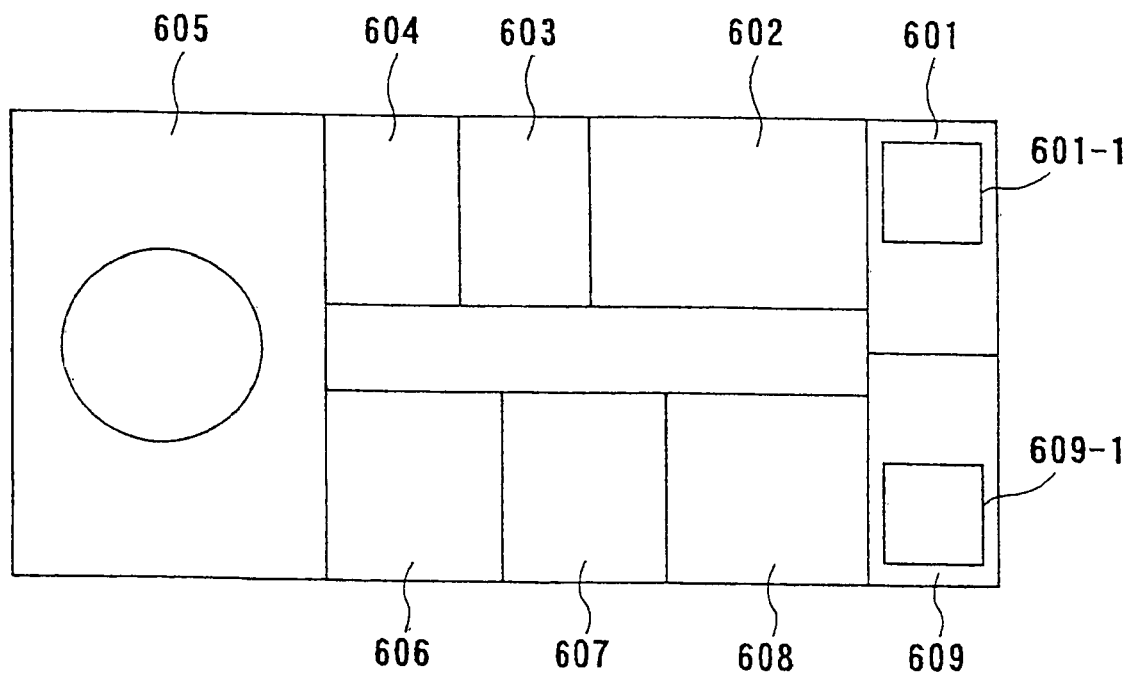
FIG. 9 is a plan view of another example of a substrate plating apparatus.

FIG. 9 is a plan view of another example of a substrate plating apparatus. The substrate plating apparatus shown in FIG. 9 comprises a loading unit 601 for loading a semiconductor substrate, a copper plating chamber 602 for plating a semiconductor substrate with copper, a pair of water cleaning chambers 603, 604 for cleaning a semiconductor substrate with water, a chemical mechanical polishing unit 605 for chemically and mechanically polishing a semiconductor substrate, a pair of water cleaning chambers 606, 607 for cleaning a semiconductor substrate with water, a drying chamber 608 for drying a semiconductor substrate, and an unloading unit 609 for unloading a semiconductor substrate with an interconnection film thereon. The substrate plating apparatus also has a substrate transfer mechanism (not shown) for transferring semiconductor substrates to the chambers 602, 603, 604, the chemical mechanical polishing unit 605, the chambers 606, 607, 608, and the unloading unit 609. The loading unit 601, the chambers 602, 603, 604, the chemical mechanical polishing unit 605, the chambers 606, 607, 608, and the unloading unit 609 are combined into a single unitary arrangement as an apparatus.

The substrate plating apparatus operates as follows: The substrate transfer mechanism transfers a semiconductor substrate W on which an interconnection film has not yet been formed from a substrate cassette 601-1 placed in the loading unit 601 to the copper plating chamber 602. In the copper plating chamber 602, a plated copper film is formed on a surface of the semiconductor substrate W having an interconnection region composed of an interconnection trench and an interconnection hole (contact hole).

After the plated copper film is formed on the semiconductor substrate W in the copper plating chamber 602, the semiconductor substrate W is transferred to one of the water cleaning chambers 603, 604 by the substrate transfer mechanism and cleaned by water in one of the water cleaning chambers 603, 604. The cleaned semiconductor substrate W is transferred to the chemical mechanical polishing unit 605 by the substrate transfer mechanism. The chemical mechanical polishing unit 605 removes the unwanted plated copper film from the surface of the semiconductor substrate W, leaving a portion of the plated copper film in the interconnection trench and the interconnection hole. A barrier layer made of TiN or the like is formed on the surface of the semiconductor substrate W, including the inner surfaces of the interconnection trench and the interconnection hole, before the plated copper film is deposited.

Then, the semiconductor substrate W with the remaining plated copper film is transferred to one of the water cleaning chambers 606, 607 by the substrate transfer mechanism and cleaned by water in one of the water cleaning chambers 606, 607. The cleaned semiconductor substrate W is then dried in the drying chamber 608, after which the dried semiconductor substrate W with the remaining plated copper film serving as an interconnection film is placed into a substrate cassette 609-1 in the unloading unit 609.

Figure 10:
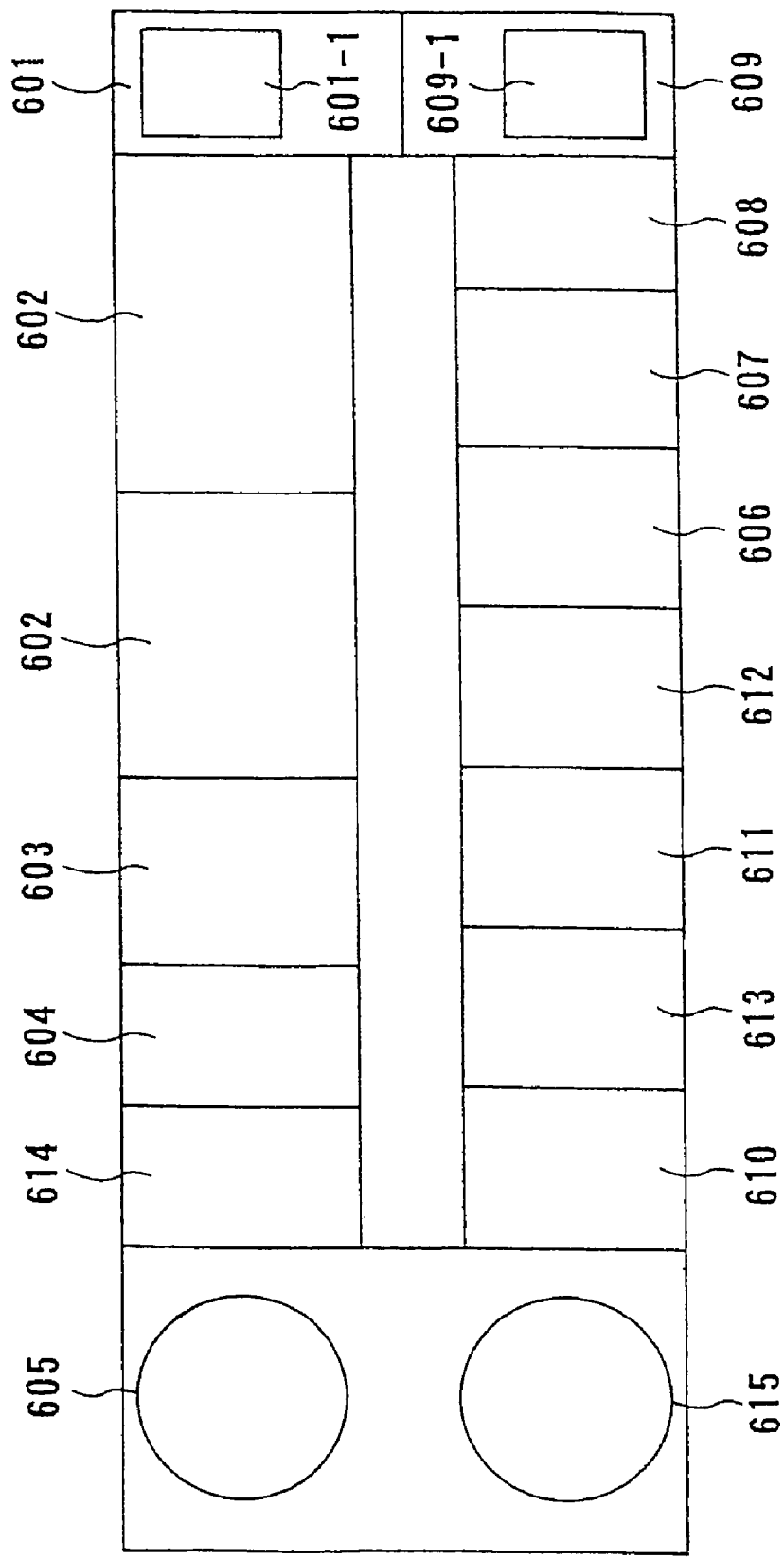
FIG. 10 is a plan view of still another example of a substrate plating apparatus.

FIG. 10 shows a plan view of still another example of a substrate plating apparatus. The substrate plating apparatus shown in FIG. 10 differs from the substrate plating apparatus shown in FIG. 9 in that it additionally includes a copper plating chamber 602, a water cleaning chamber 610, a pretreatment chamber 611, a protective layer plating chamber 612 for forming a protective plated layer on a plated copper film on a semiconductor substrate, water cleaning chamber 613, 614, and a chemical mechanical polishing unit 615. The loading unit 601, the chambers 602, 602, 603, 604, 614, the chemical mechanical polishing unit 605, 615, the chambers 606, 607, 608, 610, 611, 612, 613, and the unloading unit 609 are combined into a single unitary arrangement as an apparatus.

The substrate plating apparatus shown in FIG. 10 operates as-follows: A semiconductor substrate W is supplied from the substrate cassette 601-1 placed in the loading unit 601 successively to one of the copper plating chambers 602, 602. In one of the copper plating chamber 602, 602, a plated copper film is formed on a surface of a semiconductor substrate W having an interconnection region composed of an interconnection trench and an interconnection hole (contact hole). The two copper plating chambers 602, 602 are employed to allow the semiconductor substrate W to be plated with a copper film for a long period of time. Specifically, the semiconductor substrate W may be plated with a primary copper film according to electroless plating in one of the copper plating chamber 602, and then plated with a secondary copper film according to electroplating in the other copper plating chamber 602. The substrate plating apparatus may have more than two copper plating chambers.

The semiconductor substrate W with the plated copper film formed thereon is cleaned by water in one of the water cleaning chambers 603, 604. Then, the chemical mechanical polishing unit 605 removes the unwanted portion of the plated copper film from the surface of the semiconductor substrate W, leaving a portion of the plated copper film in the interconnection trench and the interconnection hole.

Thereafter, the semiconductor substrate W with the remaining plated copper film is transferred to the water cleaning chamber 610, in which the semiconductor substrate W is cleaned with water. Then, the semiconductor substrate W is transferred to the pretreatment chamber 611, and pretreated therein for the deposition of a protective plated layer. The pretreated semiconductor substrate W is transferred to the protective layer-plating chamber 612. In the protective layer plating chamber 612, a protective plated layer is formed on the plated copper film in the interconnection region on the semiconductor substrate W. For example, the protective plated layer is formed with an alloy of nickel (Ni) and boron (B) by electroless plating.

After the semiconductor substrate is cleaned in one of the water cleaning chambers 613, 614, an upper portion of the protective plated layer deposited on the plated copper film is polished off to planarize the protective plated layer, in the chemical mechanical polishing unit 615.

After the protective plated layer is polished, the semiconductor substrate W is cleaned by water in one of the water cleaning chambers 606, 607, dried in the drying chamber 608, and then transferred to the substrate cassette 609-1 in the unloading unit 609.

Figure 11:
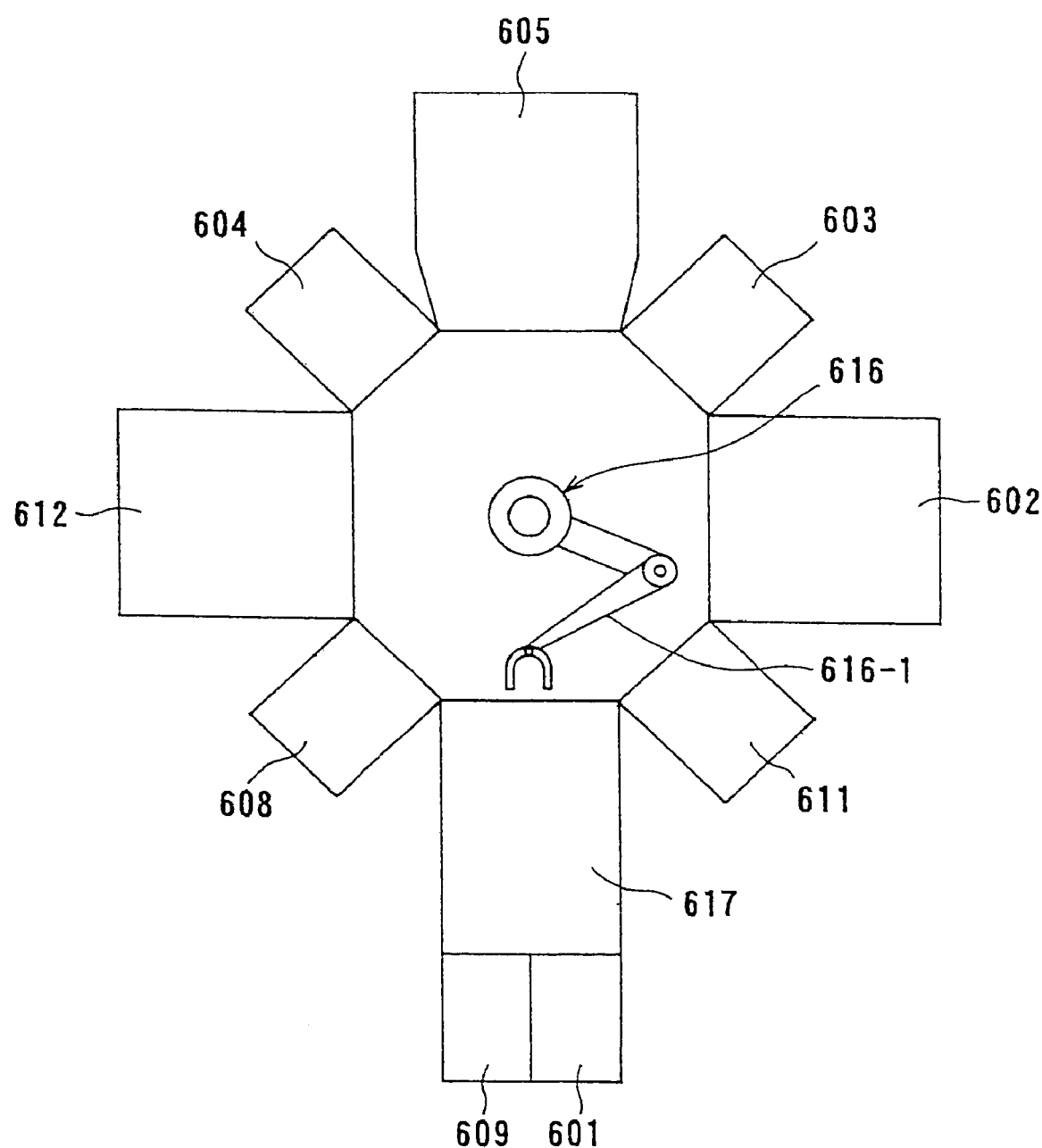
FIG. 11 is a plan view of still another example of a substrate plating apparatus.

FIG. 11 is a plan view of still another example of a substrate plating apparatus. As shown in FIG. 11, the substrate plating apparatus includes a robot 616 at its center which has a robot arm 616-1, and also has a copper plating chamber 602, a pair of water cleaning chambers 603, 604, a chemical mechanical polishing unit 605, a pretreatment chamber 611, a protective layer plating chamber 612, a drying chamber 608, and a loading/unloading station 617 which are disposed around the robot 616 and positioned within the reach of the robot arm 616-1. A loading unit 601 for loading semiconductor substrates and an unloading unit 609 for unloading semiconductor substrates is disposed adjacent to the loading/unloading station 617. The robot 616, the chambers 602, 603, 604, the chemical mechanical polishing unit 605, the chambers 608, 611, 612, the loading/unloading station 617, the loading unit 601, and the unloading unit 609 are combined into a single unitary arrangement as an apparatus.

The substrate plating apparatus shown in FIG. 11 operates as follows:

A semiconductor substrate to be plated is transferred from the loading unit 601 to the loading/unloading station 617, from which the semiconductor substrate is received by the robot arm 616-1 and transferred thereby to the copper plating chamber 602. In the copper plating chamber 602, a plated copper film is formed on a surface of the semiconductor substrate which has an interconnection region composed of an interconnection trench and an interconnection hole. The semiconductor substrate with the plated copper film formed thereon is transferred by the robot arm 616-1 to the chemical mechanical polishing unit 605. In the chemical mechanical polishing unit 605, the plated copper film is removed from the surface of the semiconductor substrate W, leaving a portion of the plated copper film in the interconnection trench and the interconnection hole.

The semiconductor substrate is then transferred by the robot arm 616-1 to the water-cleaning chamber 604, in which the semiconductor substrate is cleaned by water. Thereafter, the semiconductor substrate is transferred by the robot arm 616-1 to the pretreatment chamber 611, in which the semiconductor substrate is pretreated therein for the deposition of a protective plated layer. The pretreated semiconductor substrate is transferred by the robot arm 616-1 to the protective layer plating chamber 612. In the protective layer plating chamber 612, a protective plated layer is formed on the plated copper film in the interconnection region on the semiconductor substrate W. The semiconductor substrate with the protective plated layer formed thereon is transferred by the robot arm 616-1 to the water cleaning chamber 604, in which the semiconductor substrate is cleaned by water. The cleaned semiconductor substrate is transferred by the robot arm 616-1 to the drying chamber 608, in which the semiconductor substrate is dried. The dried semiconductor substrate is transferred by the robot arm 616-1 to the loading/unloading station 617, from which the plated semiconductor substrate is transferred to the unloading unit 609.

Figure 12:
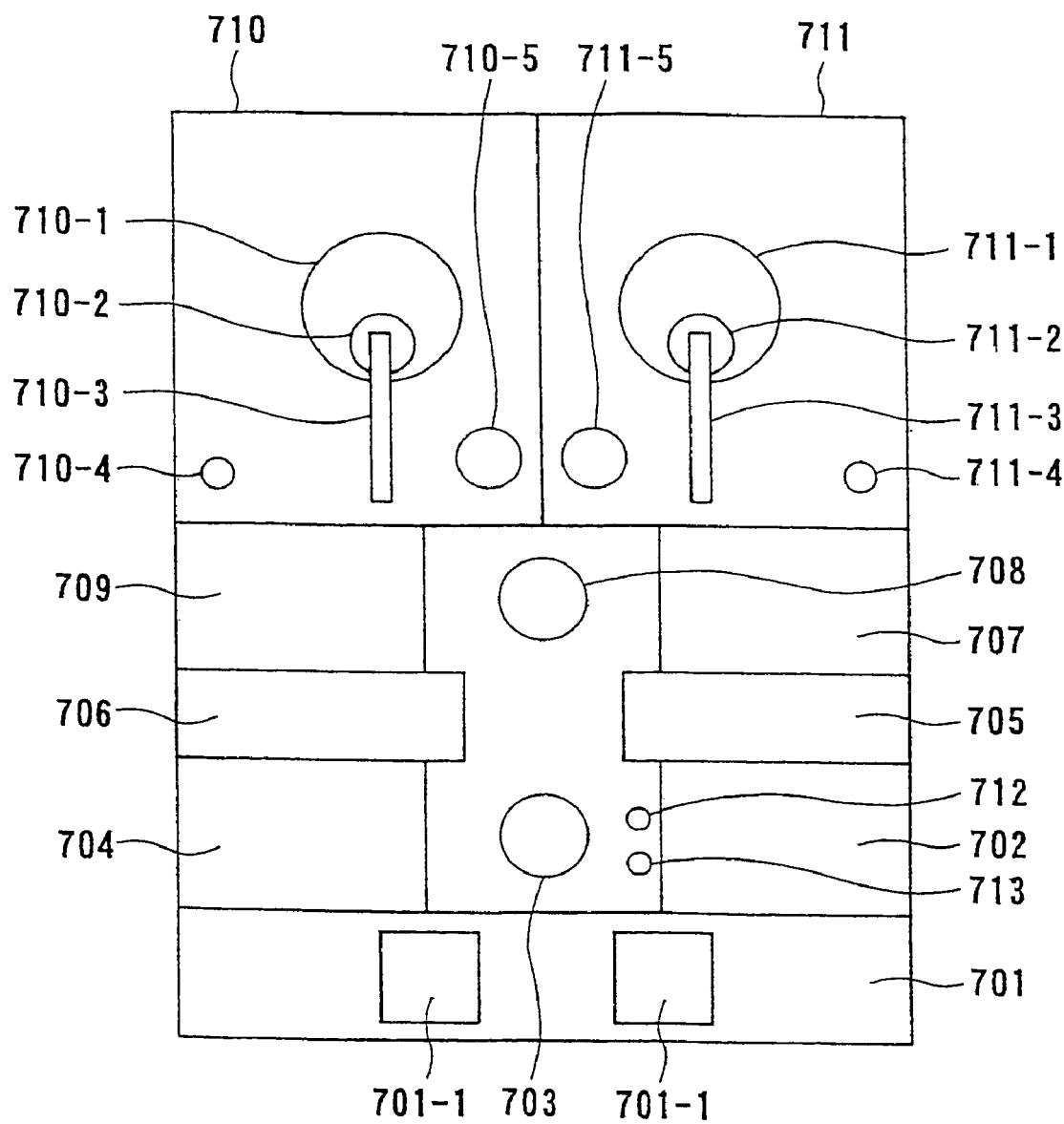
FIG. 12 is a view showing a plan constitution example of the semiconductor substrate processing apparatus.

FIG. 12 is a view showing the plan constitution of another example of a semiconductor substrate processing apparatus. The semiconductor substrate processing apparatus is of a constitution in which there are provided a loading/unloading section 701, a plated Cu film forming unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring the film thicknesses before and after plating, and a dry state film thickness measuring instrument 713 for measuring the film thickness of a semiconductor substrate W in a dry state after polishing are placed near the first robot 703.

The first polishing apparatus (polishing unit) 710 has a polishing table 710-1, a top ring 710-2, a top ring head 710-3, a film thickness measuring instrument 710-4, and a pusher 710-5. The second polishing apparatus (polishing unit) 711 has a polishing table 711-1, a top ring 711-2, a top ring head 711-3, a film thickness measuring instrument 711-4, and a pusher 711-5.

A cassette 701-1 accommodating the semiconductor substrates W, in which a via hole and a trench for interconnect are formed, and a seed layer is formed thereon is placed on a loading port of the loading/unloading section 701. The first robot 703 takes out the semiconductor substrate W from the cassette 701-1, and carries the semiconductor substrate W into the plated Cu film forming unit 702 where a plated Cu film is formed. At this time, the film thickness of the seed layer is measured with the before-plating and after-plating film thickness measuring instrument 712. The plated Cu film is formed by carrying out hydrophilic treatment of the face of the semiconductor substrate W, and then Cu plating. After formation of the plated Cu film, rinsing or cleaning of the semiconductor substrate W is carried out in the plated Cu film forming unit 702.

When the semiconductor substrate W is taken out from the plated Cu film forming unit 702 by the first robot 703, the film thickness of the plated Cu film is measured with the before-plating and after-plating film thickness measuring instrument 712. The results of its measurement are recorded into a recording device (not shown) as record data on the semiconductor substrate, and are used for judgment of an abnormality of the plated Cu film forming unit 702. After measurement of the film thickness, the first robot 703 transfers the semiconductor substrate W to the reversing machine 705, and the reversing machine 705 reverses the semiconductor substrate W (the surface on which the plated Cu film has been formed faces downward). The first polishing apparatus 710 and the second polishing apparatus 711 perform polishing in a serial mode and a parallel mode. Next, polishing in the serial mode will be described.

In the serial mode polishing, a primary polishing is performed by the polishing apparatus 710, and a secondary polishing is performed by the polishing apparatus 711. The second robot 708 picks up the semiconductor substrate W on the reversing machine 705, and places the semiconductor substrate W on the pusher 710-5 of the polishing apparatus 710. The top ring 710-2 attracts the semiconductor substrate W on the pusher 710-5 by suction, and brings the surface of the plated Cu film of the semiconductor substrate W into contact with a polishing surface of the polishing table 710-1 under pressure to perform a primary polishing. With the primary polishing, the plated Cu film is basically polished. The polishing surface of the polishing table 710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 710-5 by the top ring 710-2. The second robot 708 picks up the semiconductor substrate W, and introduces it into the first cleaning machine 709. At this time, a chemical liquid may be ejected toward the face and backside of the semiconductor substrate W on the pusher 710-5 to remove particles therefrom or cause particles to be difficult to adhere thereto.

After completion of cleaning in the first cleaning machine 709, the second robot 708 picks up the semiconductor substrate W, and places the semiconductor substrate W on the pusher 711-5 of the second polishing apparatus 711. The top ring 711-2 attracts the semiconductor substrate W on the pusher 711-5 by suction, and brings the surface of the semiconductor substrate W, which has the barrier layer formed thereon, into contact with a polishing surface of the polishing table 711-1 under pressure to perform the secondary polishing. The constitution of the polishing table is the same as the top ring 711-2. With this secondary polishing, the barrier layer is polished. However, there may be a case in which a Cu film and an oxide film left after the primary polishing are also polished.

A polishing surface of the polishing table 711-1 is composed of foamed polyurethane such as IC1000, or a material having abrasive grains fixed thereto or impregnated therein. Upon relative movements of the polishing surface and the semiconductor substrate W, polishing is carried out. At this time, silica, alumina, ceria, or the like is used as abrasive grains or slurry. A chemical liquid is adjusted depending on the type of the film to be polished.

Detection of an end point of the secondary polishing is performed by measuring the film thickness of the barrier layer mainly with the use of the optical film thickness measuring instrument, and detecting the film thickness which has become zero, or the surface of an insulating film comprising $SiO_2$ shows up. Furthermore, a film thickness measuring instrument with an image processing function is used as the film thickness measuring instrument 711-4 provided near the polishing table 711-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the endpoint of the secondary polishing is not reached, re-polishing is performed. If over-polishing has been performed beyond a prescribed value due to any abnormality, then the semiconductor substrate processing apparatus is stopped to avoid subsequent polishing so that defective products will not increase.

After completion of the secondary polishing, the semiconductor substrate W is moved to the pusher 711-5 by the top ring 711-2. The second robot 708 picks up the semiconductor substrate W on the pusher 711-5. At this time, a chemical liquid may be ejected toward the face and backside of the semiconductor substrate W on the pusher 711-5 to remove particles therefrom or cause particles to be difficult to adhere thereto.

The second robot 708 carries the semiconductor substrate W into the second cleaning machine 707 where cleaning of the semiconductor substrate W is performed. The constitution of the second cleaning machine 707 is also the same as the constitution of the first cleaning machine 709. The face of the semiconductor substrate W is scrubbed with the PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of the diffused Cu thereon. If there is no problem of diffusion, scrubbing cleaning is performed with the PVA sponge rolls using the same chemical liquid as that used for the face.

After completion of the above cleaning, the second robot 708 picks up the semiconductor substrate W and transfers it to the reversing machine 706, and the reversing machine 706 reverses the semiconductor substrate W. The semiconductor substrate W which has been reversed is picked up by the first robot 703, and transferred to the third cleaning machine 704. In the third cleaning machine 704, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying.

As described above, if the film thickness has been measured with the film thickness measuring instrument 711-4 provided near the polishing table 711-1, then the semiconductor substrate W is not subjected to further process and is accommodated into the cassette placed on the unloading port of the loading/unloading section 701.

Figure 13:
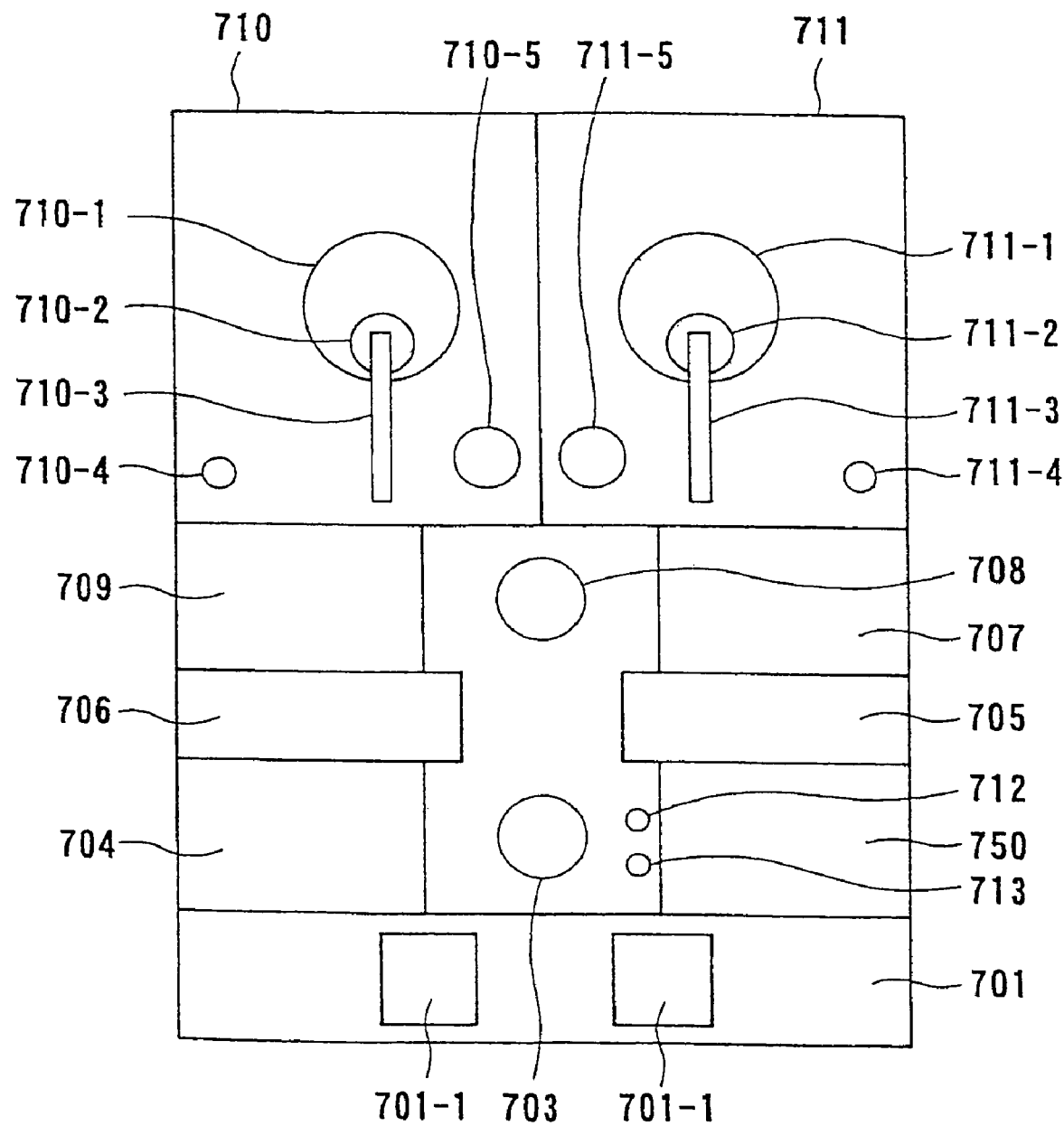
FIG. 13 is a view showing another plan constitution example of the semiconductor substrate processing apparatus.

FIG. 13 is a view showing the plan constitution of another example of a semiconductor substrate processing apparatus. The substrate processing apparatus differs from the substrate processing apparatus shown in FIG. 12 in that a cap plating unit 750 is provided instead of the plated Cu film forming unit 702 in FIG. 12.

A cassette 701-1 accommodating the semiconductor substrates W formed plated Cu film is placed on a load port of a loading/unloading section 701. The semiconductor substrate W taken out from the cassette 701-1 is transferred to the first polishing apparatus 710 or second polishing apparatus 711 in which the surface of the plated Cu film is polished. After completion of polishing of the plated Cu film, the semiconductor substrate W is cleaned in the first cleaning machine 709.

After completion of cleaning in the first cleaning machine 709, the semiconductor substrate W is transferred to the cap plating unit 750 where cap plating is applied onto the surface of the plated Cu film with the aim of preventing oxidation of plated Cu film due to the atmosphere. The semiconductor substrate to which cap plating has been applied is carried by the second robot 708 from the cap plating unit 750 to the second cleaning machine 707 where it is cleaned with pure water or deionized water. The semiconductor substrate after completion of cleaning is returned into the cassette 701-1 placed on the loading/unloading section 701.

Figure 14:
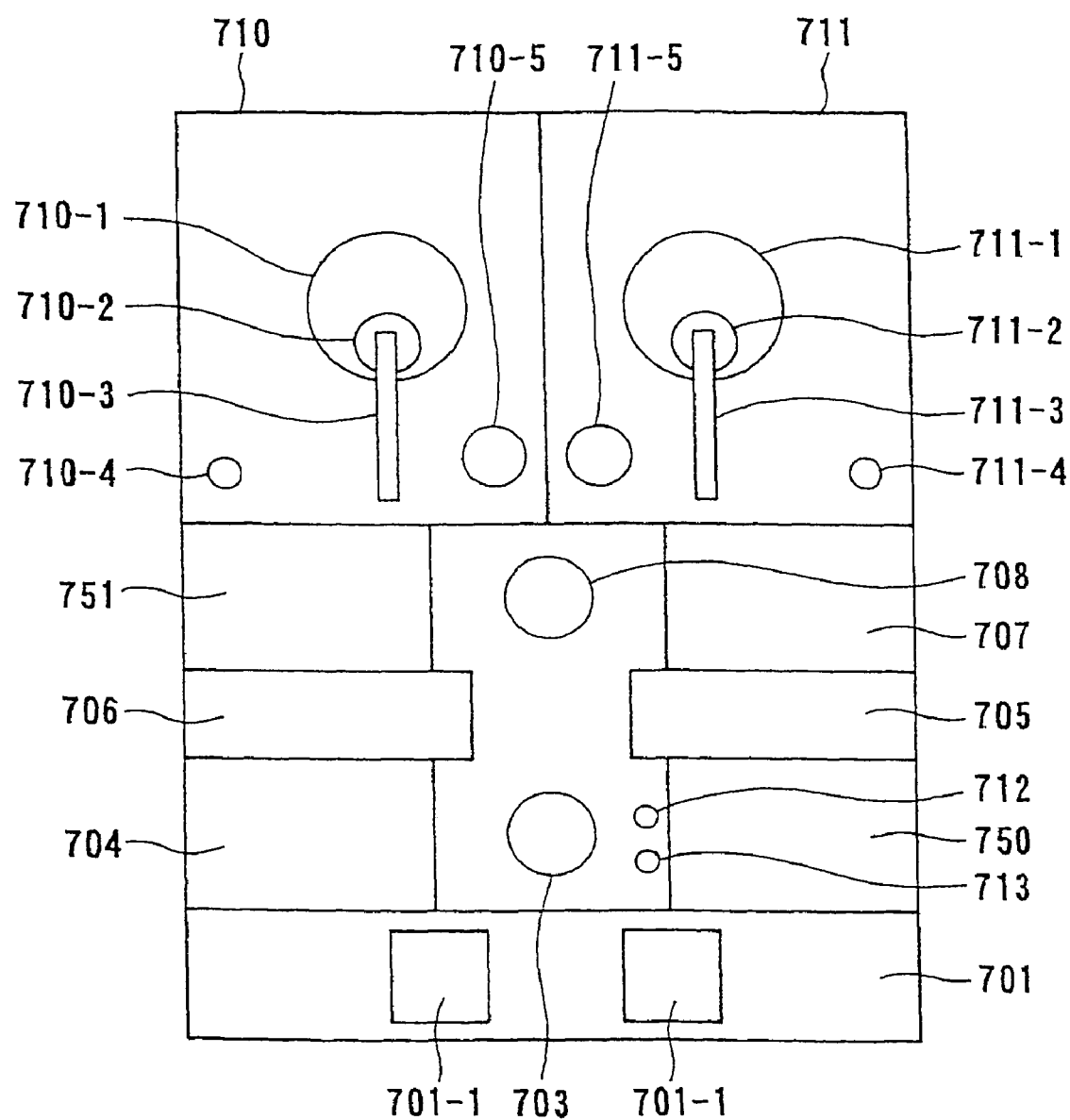
FIG. 14 is a view showing still another plan constitution example of the semiconductor substrate processing apparatus.

FIG. 14 is a view showing the plan constitution of still another example of a semiconductor substrate processing apparatus. The substrate processing apparatus differs from the substrate processing apparatus shown in FIG. 13 in that an annealing unit 751 is provided instead of the first cleaning machine 709 in FIG. 13.

The semiconductor substrate W, which is polished in the polishing unit 710 or 711, and cleaned in the second cleaning machine 707 described above, is transferred to the cap plating unit 750 where cap plating is applied onto the surface of the plated Cu film. The semiconductor substrate to which cap plating has been applied is carried by the second robot 708 from the cap plating unit 750 to the second cleaning machine 707 where it is cleaned.

After completion of cleaning in the second cleaning machine 707, the semiconductor substrate W is transferred to the annealing unit 751 in which the substrate is annealed, whereby the plated Cu film is alloyed so as to increase the electromigration resistance of the plated Cu film. The semiconductor substrate W to which annealing treatment has been applied is carried from the annealing unit 751 to the second cleaning machine 707 where it is cleaned with pure water or deionized water. The semiconductor substrate W after completion of cleaning is returned into the cassette 701-1 placed on the loading/unloading section 701.

Figure 15:
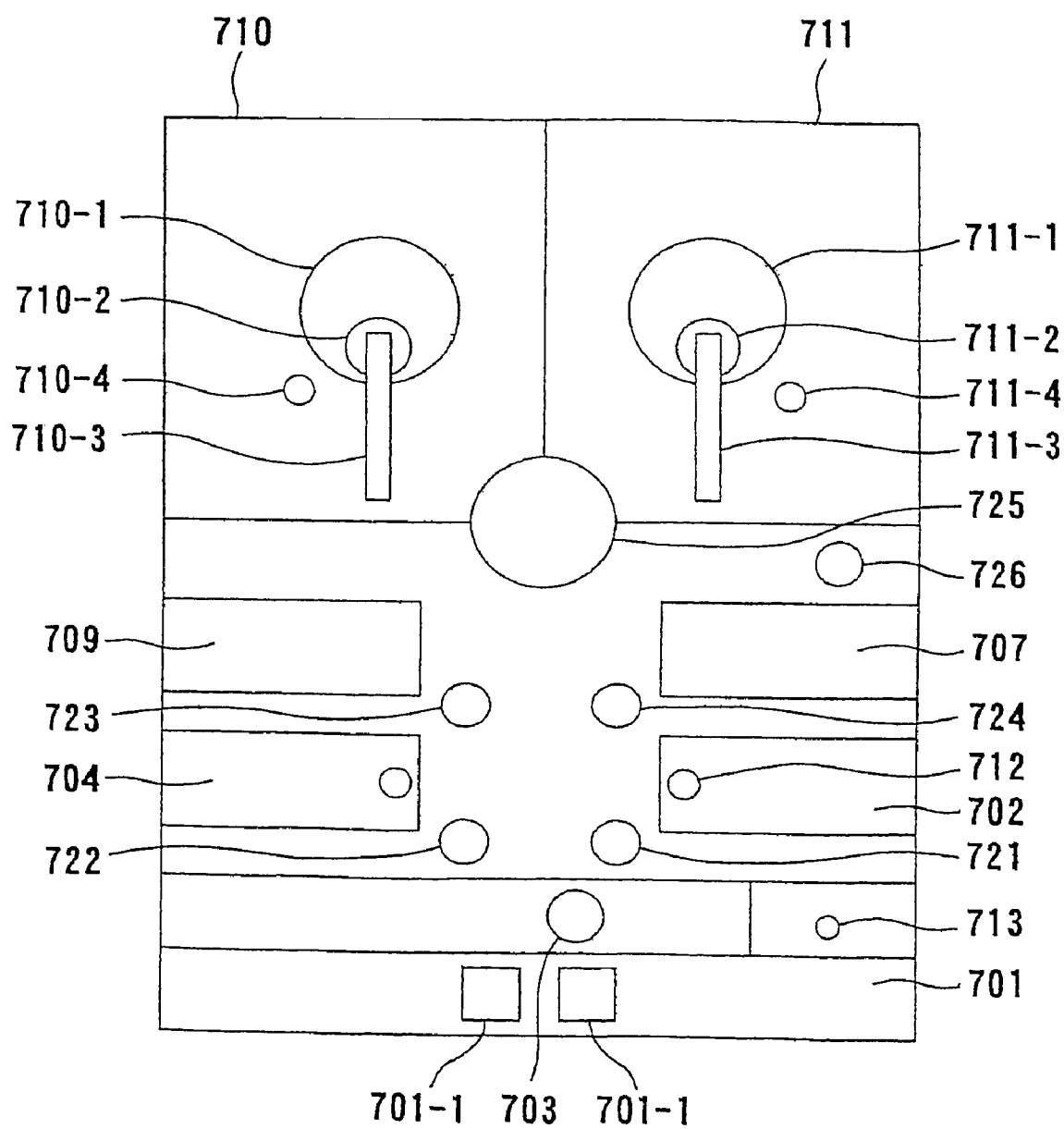
FIG. 15 is a view showing still another plan constitution example of the semiconductor substrate processing apparatus.

FIG. 15 is a view showing a plan layout constitution of another example of the substrate processing apparatus. In FIG. 15, portions denoted by the same reference numerals as those in FIG. 12 show the same or corresponding portions. In the substrate processing apparatus, a pusher indexer 725 is disposed close to a first polishing apparatus 710 and a second polishing apparatus 711. Substrate placing tables 721, 722 are disposed close to a third cleaning machine 704 and a plated Cu film forming unit 702, respectively. A robot 723 is disposed close to a first cleaning machine 709 and the third cleaning machine 704. Further, a robot 724 is disposed close to a second cleaning machine 707 and the plated Cu film forming unit 702, and a dry state film thickness measuring instrument 713 is disposed close to a loading/unloading section 701 and a first robot 703.

In the substrate processing apparatus of the above constitution, the first robot 703 takes out a semiconductor substrate W from a cassette 701-1 placed on the load port of the loading/unloading section 701. After the film thicknesses of a barrier layer and a seed layer are measured with the dry state film thickness measuring instrument 713, the first robot 703 places the semiconductor substrate Won the substrate placing table 721. In the case where the dry state film thickness measuring instrument 713 is provided on the hand of the first robot 703, the film thicknesses are measured thereon, and the substrate is placed on the substrate placing table 721. The second robot 723 transfers the semiconductor substrate W on the substrate placing table 721 to the plated Cu film forming unit 702 in which a plated Cu film is formed. After formation of the plated Cu film, the film thickness of the plated-Cu film is measured with a before-plating and after-plating film thickness measuring instrument 712. Then, the second robot 723 transfers the semiconductor substrate W to the pusher indexer 725 and loads it thereon.

[Serial Mode]

In the serial mode, a top ring 710-2 holds the semiconductor substrate W on the pusher indexer 725 by suction, transfers it to a polishing table 710-1, and presses the semiconductor substrate W against a polishing surface on the polishing table 710-1 to perform polishing. Detection of the end point of polishing is performed by the same method as described above. The semiconductor substrate W after completion of polishing is transferred to the pusher indexer 725 by the top ring 710-2, and loaded thereon. The second robot 723 takes out the semiconductor substrate W, and carries it into the first cleaning machine 709 for cleaning. Then, the semiconductor substrate W is transferred to the pusher indexer 725, and loaded thereon.

A top ring 711-2 holds the semiconductor substrate W on the pusher indexer 725 by suction, transfers it to a polishing table 711-1, and presses the semiconductor substrate W against a polishing surface on the polishing table 711-1 to perform polishing. Detection of the end point of polishing is performed by the same method as described above. The semiconductor substrate W after completion of polishing is transferred to the pusher indexer 725 by the top ring 711-2, and loaded thereon. The third robot 724 picks up the semiconductor substrate W, and its film thickness is measured with a film thickness measuring instrument 726. Then, the semiconductor substrate W is carried into the second cleaning machine 707 for cleaning. Thereafter, the semiconductor substrate W is carried into the third cleaning machine 704, where it is cleaned and then dried by spin-drying. Then, the semiconductor substrate W is picked up by the third robot 724, and placed on the substrate placing table 722.

[Parallel Mode]

In the parallel mode, the top ring 710-2 or 711-2 holds the semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of the film thickness, the third robot 724 picks up the semiconductor substrate W, and places it on the substrate placing table 722.

The first robot 703 transfers the semiconductor substrate W on the substrate placing table 722 to the dry state film thickness measuring instrument 713. After the film thickness is measured, the semiconductor substrate W is returned to the cassette 701-1 of the loading/unloading section 701.

Figure 16:
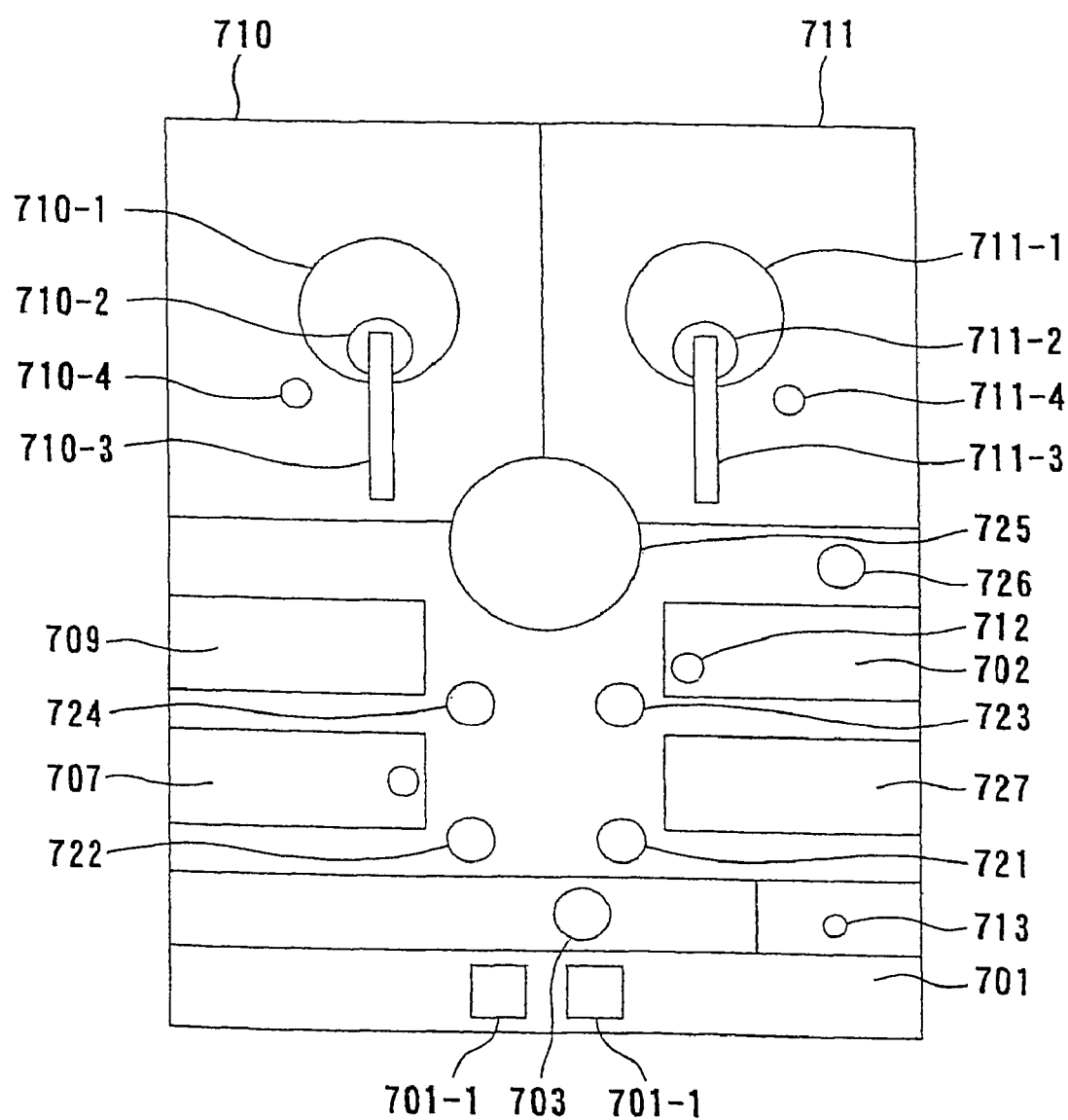
FIG. 16 is a view showing still another plan constitution example of the semiconductor substrate processing apparatus.

FIG. 16 is a view showing another plan layout constitution of the substrate processing apparatus. The substrate processing apparatus is such a substrate processing apparatus which forms a seed layer and a plated Cu film on a semiconductor substrate W having no seed layer formed thereon, and polishes these films to form interconnects.

In the substrate polishing apparatus, a pusher indexer 725 is disposed close to a first polishing apparatus 710 and a second polishing apparatus 711, substrate placing tables 721, 722 are disposed close to a second cleaning machine 707 and a seed layer forming unit 727, respectively, and a robot 723 is disposed close to the seed layer forming unit 727 and a plated Cu film forming unit 702. Further, a robot 724 is disposed close to a first cleaning machine 709 and the second cleaning machine 707, and a dry state film thickness measuring instrument 713 is disposed close to a loading/unloading section 701 and a first robot 703.

The first robot 703 takes out a semiconductor substrate W having a barrier layer thereon from a cassette 701-1 placed on the load port of the loading/unloading section 701, and places it on the substrate placing table 721. Then, the second robot 723 transfers the semiconductor substrate W to the seed layer forming unit 727 where a seed layer is formed. The seed layer is formed by electroless plating. The second robot 723 enables the semiconductor substrate having the seed layer formed thereon to be measured in thickness of the seed layer by the before-plating and after-plating film thickness measuring instrument 712. After measurement of the film thickness, the semiconductor substrate is carried into the plated Cu film forming unit 702 where a plated Cu film is formed.

After formation of the plated Cu film, its film thickness is measured, and the semiconductor substrate is transferred to a pusher indexer 725. A top ring 710-2 or 711-2 holds the semiconductor substrate W on the pusher indexer 725 by suction, and transfers it to a polishing table 710-1 or 711-1 to perform polishing. After polishing, the top ring 710-2 or 711-2 transfers the semiconductor substrate W to a film thickness measuring instrument 710-4 or 711-4 to measure the film thickness. Then, the top ring 710-2 or 711-2 transfers the semiconductor substrate W to the pusher indexer 725, and places it thereon.

Then, the third robot 724 picks up the semiconductor substrate W from the pusher indexer 725, and carries it into the first cleaning machine 709. The third robot 724 picks up the cleaned semiconductor substrate W from the first cleaning machine 709, carries it into the second cleaning machine 707, and places the cleaned and dried semiconductor substrate on the substrate placing table 722. Then, the first robot 703 picks up the semiconductor substrate W, and transfers it to the dry state film thickness measuring instrument 713 in which the film thickness is measured, and the first robot 703 carries it into the cassette 701-1 placed on the unload port of the loading/unloading section 701.

In the substrate processing apparatus shown in FIG. 16, interconnects are formed by forming a barrier layer, a seed layer and a plated Cu film on a semiconductor substrate W having a via hole or a trench of a circuit pattern formed therein, and polishing them.

The cassette 701-1 accommodating the semiconductor substrates W before formation of the barrier layer is placed on the load port of the loading/unloading section 701. The first robot 703 takes out the semiconductor substrate W from the cassette 701-1 placed on the load port of the loading/unloading section 701, and places it on the substrate placing table 721. Then, the second robot 723 transfers the semiconductor substrate W to the seed layer forming unit 727 where a barrier layer and a seed layer are formed. The barrier layer and the seed layer are formed by electroless plating. The second robot 723 brings the semiconductor substrate W having the barrier layer and the seed layer formed thereon to the before-plating and after-plating film thickness measuring instrument 712 which measures the film thicknesses of the barrier layer and the seed layer. After measurement of the film thicknesses, the semiconductor substrate W is carried into the plated Cu film forming unit 702 where a plated Cu film is formed.

Figure 17:
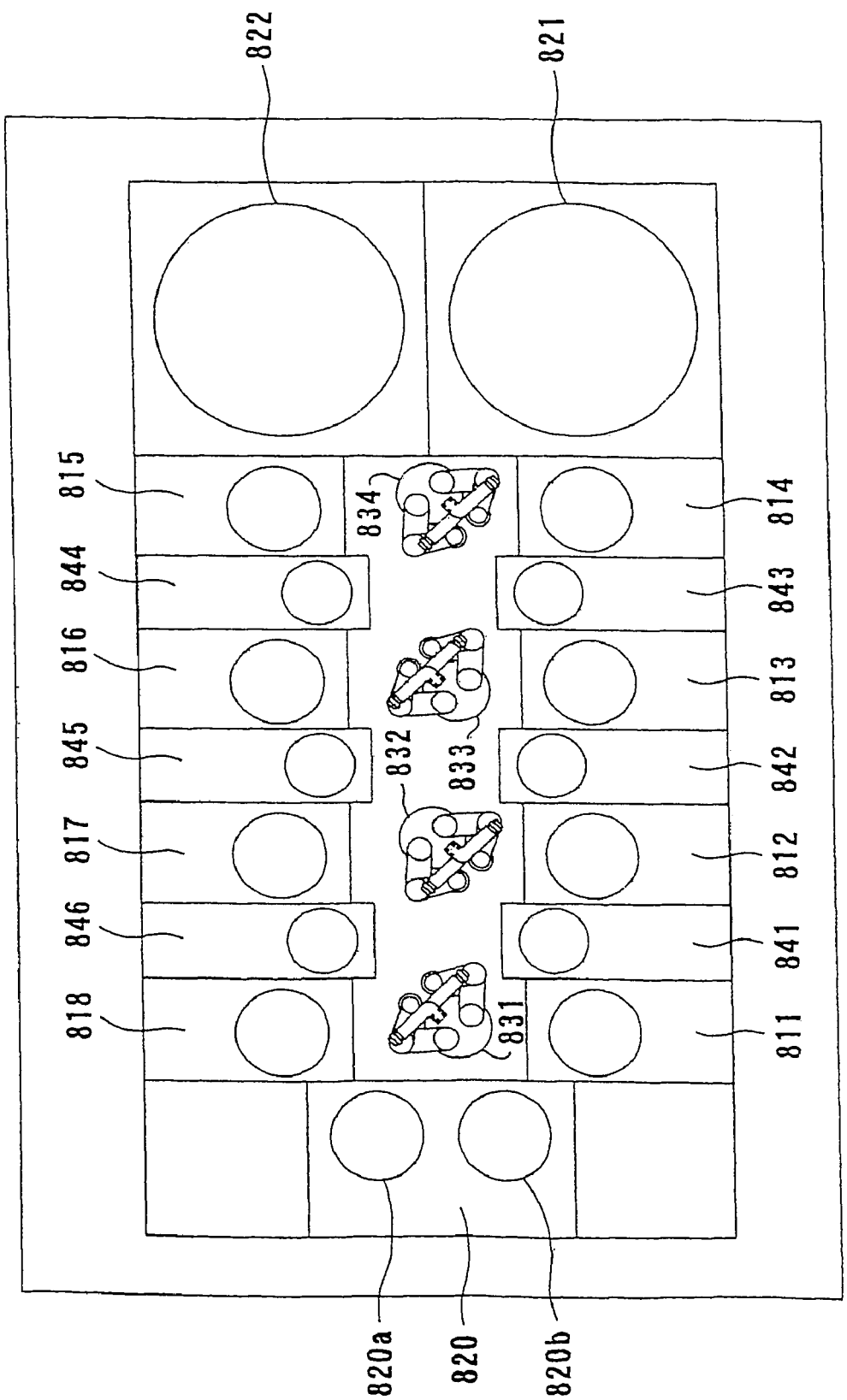
FIG. 17 is a view showing still another plan constitution example of the semiconductor substrate processing apparatus.

FIG. 17 is a view showing plan layout constitution of another example of the substrate processing apparatus. In the substrate processing apparatus, there are provided a barrier layer forming unit 811, a seed layer forming unit 812, a plated film forming unit 813, an annealing unit 814, a first cleaning unit 815, a bevel and backside cleaning unit 816, a cap plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placing table 845, a third film thickness measuring instrument 846, a loading/unloading section 820, a first polishing apparatus 821, a second polishing apparatus 822, a first robot 831, a second robot 832, a third robot 833, and a fourth robot 834. The film thickness measuring instruments 841, 842, and 846 are units, have the same size as the frontage dimension of other units (plating, cleaning, annealing units, and the like), and are thus interchangeable.

In this example, an electroless Co—B plating apparatus can be used as the barrier layer forming unit 811, an electroless Cu plating apparatus as the seed layer forming unit 812, and an electroplating apparatus as the plated film forming unit 813.

Figure 18:
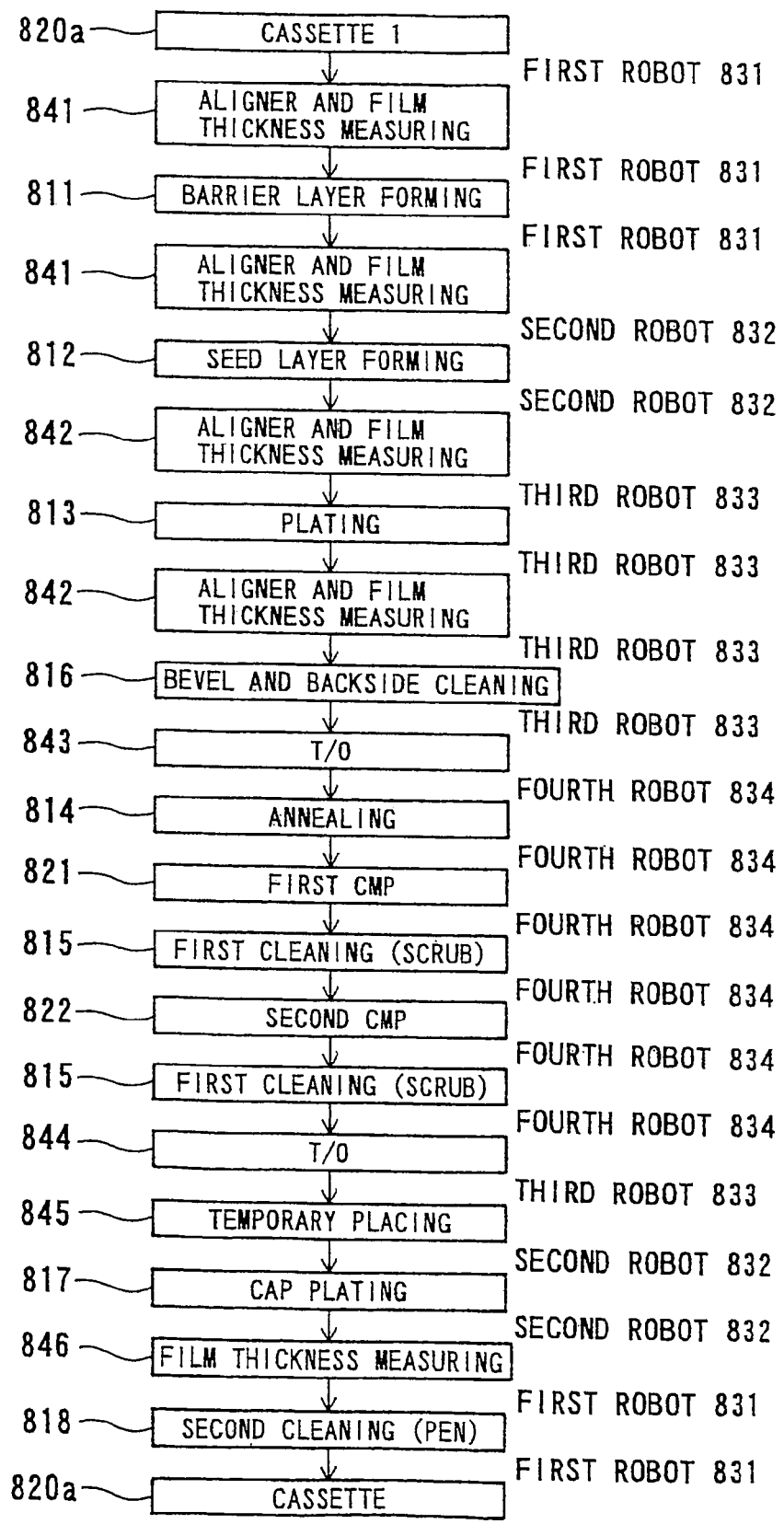
FIG. 18 is a view showing a flow of the respective steps in the semiconductor substrate processing apparatus illustrated in FIG. 17.

FIG. 18 is a flow chart showing the flow of the respective steps in the present substrate processing apparatus. The respective steps in the apparatus will be described according to this flow chart. First, a semiconductor substrate taken out by the first robot 831 from a cassette 820a placed on the load and unload section 820 is placed in the first aligner and film thickness measuring instrument 841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transferred to the barrier layer forming unit 811 by the first robot 831. The barrier layer forming unit 811 is such an apparatus for forming a barrier layer on the semiconductor substrate by electroless Co—B plating, and the barrier layer forming unit 811 forms a Co—B film as a film for preventing Cu from diffusing into an interlayer insulator film (e.g. $SiO_2$) of a semiconductor device. The semiconductor substrate discharged after cleaning and drying steps is transferred by the first robot 831 to the first aligner and film thickness measuring instrument 841, where the film thickness of the semiconductor substrate, i.e., the film thickness of the barrier layer is measured.

The semiconductor substrate after film thickness measurement is carried into the seed layer forming unit 812 by the second robot 832, and a seed layer is formed on the barrier layer by electroless Cu plating. The semiconductor substrate discharged after cleaning and drying steps is transferred by the second robot 832 to the second aligner and film thickness measuring instrument 842 for determination of a notch position, before the semiconductor substrate is transferred to the plated film forming unit 813, which is an impregnation plating unit, and then notch alignment for Cu plating is performed by the film thickness measuring instrument 842. If necessary, the film thickness of the semiconductor substrate before formation of a Cu film may be measured again in the film thickness measuring instrument 842.

The semiconductor substrate which has completed notch alignment is transferred by the third robot 833 to the plated film forming unit 813 where Cu plating is applied to the semiconductor substrate. The semiconductor substrate discharged after cleaning and drying steps is transferred by the third robot 833 to the bevel and backside cleaning unit 816 where an unnecessary Cu film (seed layer) at a peripheral portion of the semiconductor substrate is removed. In the bevel and backside cleaning unit 816, the bevel is etched in a preset time, and Cu adhering to the backside of the semiconductor substrate is cleaned with a chemical liquid such as hydrofluoric acid. At this time, before transferring the semiconductor substrate to the bevel and backside cleaning unit 816, film thickness measurement of the semiconductor substrate may be made by the second aligner and film thickness measuring instrument 842 to obtain the thickness value of the Cu film formed by plating. Based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel and backside cleaning unit 816 is transferred by the third robot 833 to the substrate reversing machine 843. After the semiconductor substrate is turned over by the substrate reversing machine 843 to cause the plated surface to be directed downward, the semiconductor substrate is introduced into the annealing unit 814 by the fourth robot 834 for thereby stabilizing an interconnection portion. Before and/or after annealing treatment, the semiconductor substrate is carried into the second aligner and film thickness measuring instrument 842 where the film thickness of a copper film formed on the semiconductor substrate is measured. Then, the semiconductor substrate is carried by the fourth robot 834 into the first polishing apparatus 821 in which the Cu film and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transferred by the fourth robot 834 to the first cleaning unit 815 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transferred by the fourth robot 834 to the second polishing apparatus 822 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transferred by the fourth robot 834 again to the first cleaning unit 815 where scrub-cleaning is performed. After completion of cleaning, the semiconductor substrate is transferred by the fourth robot 834 to the second substrate reversing machine 844 where the semiconductor substrate is reversed to cause the plated surface to be directed upward, and then the semiconductor substrate is placed on the substrate temporary placing table 845 by the third robot.

The semiconductor substrate is transferred by the second robot 832 from the substrate temporary placing table 845 to the cap plating unit 817 where cap plating is applied onto the Cu surface with the aim of preventing oxidation of Cu due to the atmosphere. The semiconductor substrate to which cap plating has been applied is carried by the second robot 832 from the cap plating unit 817 to the third film thickness measuring instrument 846 where the thickness of the copper film is measured. Thereafter, the semiconductor substrate is carried by the first robot 831 into the second cleaning unit 818 where it is cleaned with pure water or deionized water. The semiconductor substrate after completion of cleaning is returned into the cassette 820a placed on the loading/unloading section 820.

The aligner and film thickness measuring instrument 841 and the aligner and film thickness measuring instrument 842 perform positioning of the notch portion of the substrate and measurement of the film thickness.

The seed layer forming unit 812 may be omitted. In this case, a plated film may be formed on a barrier layer directly in a plated film forming unit 813.

Figure 19:
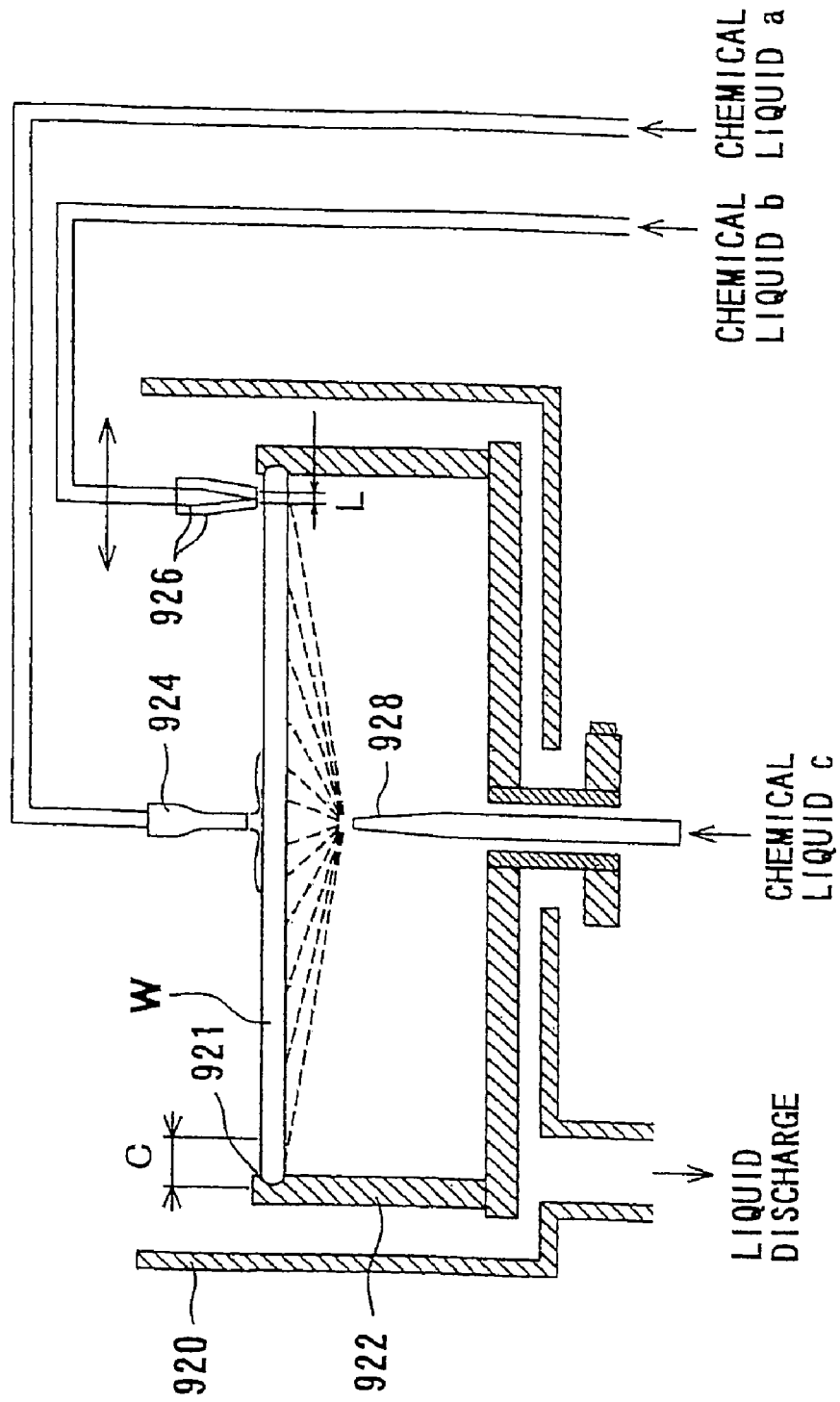
FIG. 19 is a view showing a schematic constitution example of a bevel and backside cleaning unit.

The bevel and backside cleaning unit 816 can perform an edge (bevel) Cu etching and a backside cleaning at the same time, and can suppress growth of a natural oxide film of copper at the circuit formation portion on the surface of the substrate. FIG. 19 shows a schematic view of the bevel and backside cleaning unit 816. As shown in FIG. 19, the bevel and backside cleaning unit 816 has a substrate holding portion 922 positioned inside a bottomed cylindrical waterproof cover 920 and adapted to rotate a substrate W at a high speed, in such a state that the face of the substrate W faces upwardly, while holding the substrate W horizontally by spin chucks 921 at a plurality of locations along a circumferential direction of a peripheral edge portion of the substrate, a center nozzle 924 placed above a nearly central portion of the face of the substrate W held by the substrate holding portion 922, and an edge nozzle 926 placed above the peripheral edge portion of the substrate W. The center nozzle 924 and the edge nozzle 926 are directed downward. Aback nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not, problematic, the copper film within the edge cut width C can be removed.

Next, the method of cleaning with this cleaning apparatus will be described. First, the semiconductor substrate W is horizontally rotated integrally with the substrate holding portion 922, with the substrate being held horizontally by the spin chucks 921 of the substrate holding portion 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion C of the semiconductor substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of the solutions which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase in the electrical resistance. In the presence of annealing, thin interconnection showed no voids. Thus, the degree of grain growth is presumed to be involved in these phenomena. That is, the following mechanism can be speculated: It is difficult for grain growth to occur in thin interconnections. In broad interconnections, on the other hand, grain growth proceeds in accordance with annealing treatment. During the process of grain growth, ultra-fine pores in the plated film, which are too small to be seen by the SEM (scanning electron microscope), gather and move upward, thus forming microvoid-like depressions in the upper part of the interconnection. The annealing conditions in the annealing unit 814 are such that hydrogen (2% or less) is added in a gas atmosphere, the temperature is in the range of 300° C. to 400° C., and the time is in the range of 1 to 5 minutes. Under these conditions, the above effects were obtained.

Figure 20:
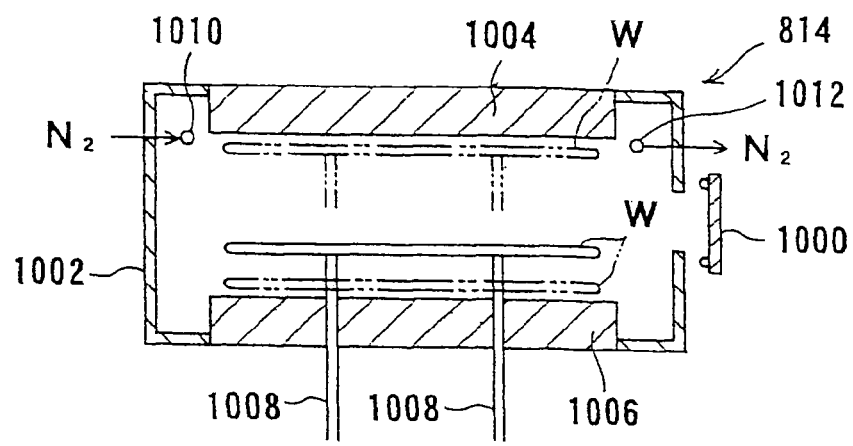
FIG. 20 is a vertical sectional view of an example of an annealing unit.
Figure 21:
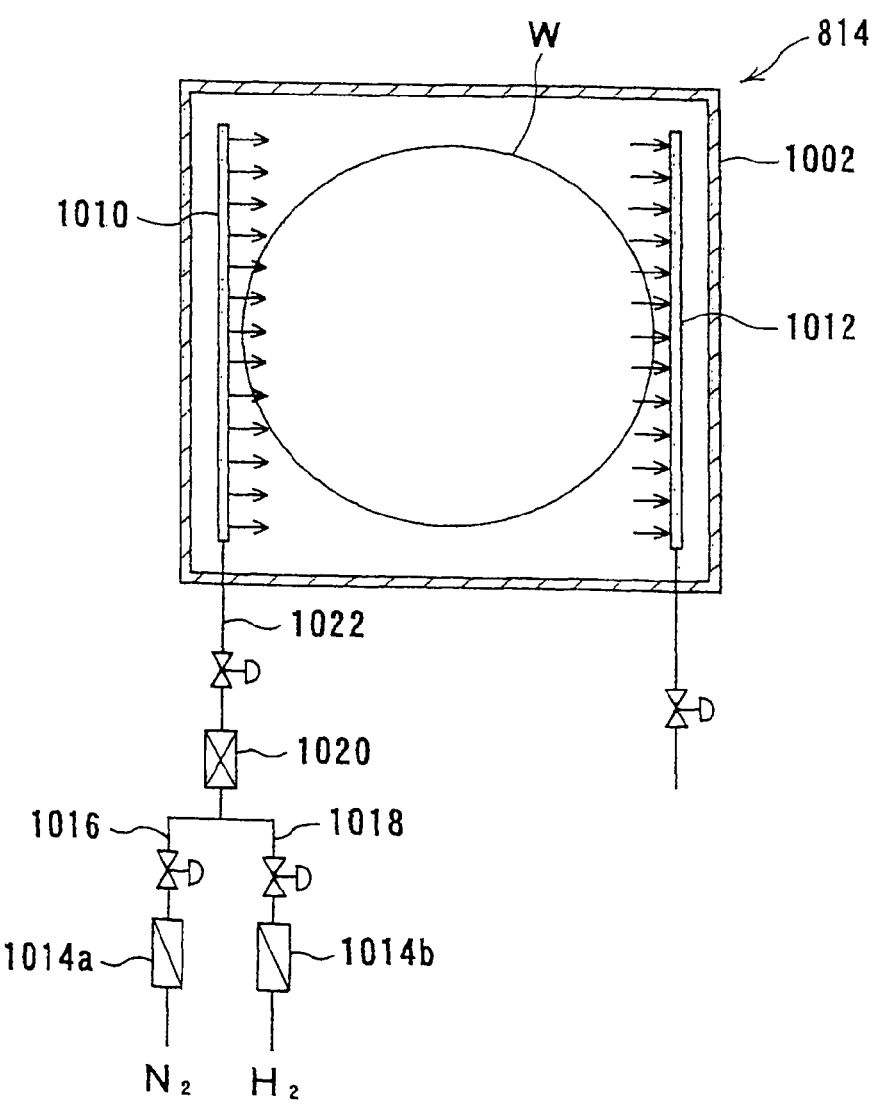
FIG. 21 is a transverse sectional view of the annealing unit.

FIGS. 20 and 21 show the annealing unit 814. The annealing unit 814 comprises a chamber 1002 having a gate 1000 for taking in and taking out the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 814 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014*a*, and a $H_2$ gas introduced through a $H_2$ gas introduction line 1018 containing a filter 1014*b*, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes e.g. 0.1-1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100-600° C.

After the completion of the annealing, the elevating pins 1008 are lowered down to a position at which the distance between the semiconductor substrate W held on the elevating pins 1008 and the cool plate 1006 becomes e.g. 0-0.5 mm. In this state, by introducing a cooling water into the cool plate 1006, the semiconductor substrate W is cooled by the cool plate to a temperature of 100° C. or lower in e.g. 10-60 seconds. The cooled semiconductor substrate is sent to the next step.

A mixed gas of $N_2$ gas with several % of $H_2$ gas is used as the above antioxidant gas. However, $N_2$ gas may be used singly.

The annealing unit may be placed in the electroplating apparatus.

The cap plating described above is preferably performed by electroless plating process, but may be performed by electroplating process.

Although certain preferred embodiments of the present invention have been shown and described in detail, it should be understood that various changes and modifications may be made therein without departing from the scope of the appended claims.

INDUSTRIAL APPLICABILITY

This invention relates to a plating solution useful for forming embedded interconnects by embedding an electric conductor in fine recesses for interconnects provided in the surface of a substrate, such as a semiconductor substrate, or for forming a protective layer for protecting the surface of embedded interconnects, a semiconductor device manufactured by using the plating solution and a method for manufacturing the semiconductor device.

The invention claimed is:

1. A method for manufacturing a semiconductor device, comprising:

plating a surface of a semiconductor substrate with a copper alloy, the surface having an embedded interconnect structure of copper interconnects, thereby forming a protective layer of the copper alloy selectively on at least part of an exposed surface of the copper interconnects for protecting the copper interconnects;

wherein the copper alloy is a copper-cobalt alloy in which the cobalt does not form a solid solution with copper.

2. The method according to claim 1, wherein the copper content of the copper alloy is in a range of 90 at % to 99.99 at %.

3. The method according to claim 1, further comprising:

forming the copper interconnects embedded in the surface of the semiconductor substrate; and after completion of said forming of the copper interconnects, performing said plating of the semiconductor substrate to selectively form the protective layer of the copper alloy on the at least part of the exposed surface of the copper interconnects.

4. The method according to claim 3, wherein said forming of the copper interconnects comprises: forming fine recesses in the surface of the semiconductor substrate;

after completion of said forming of the fine recesses, covering the surface having the fine recesses formed therein with a barrier layer so as to cover surfaces of the fine recesses with the barrier layer;

after completion of said covering of the fine recesses with the barrier layer, forming a seed layer over the barrier layer; and after completion of said forming of the seed layer, plating the surface of the semiconductor substrate with the copper alloy so as to form the copper interconnects embedded in the surface of the semiconductor substrate.

5. The method according to claim 1, wherein said plating the surface of the semiconductor substrate comprises bringing the surface into contact with a plating solution including copper ions and cobalt ions.

* * * * *